(12) United States Patent
Lu

(10) Patent No.: US 11,451,168 B2
(45) Date of Patent: Sep. 20, 2022

(54) STRAIN-RELIEVED COMPLIANT STRUCTURES FOR FLEXTENSIONAL TRANSDUCTION

(71) Applicant: Shihyu Lu, Mount Laurel, NJ (US)

(72) Inventor: Shihyu Lu, Mount Laurel, NJ (US)

( * ) Notice: Subject to any disclaimer, the term of this patent is extended or adjusted under 35 U.S.C. 154(b) by 299 days.

(21) Appl. No.: 16/881,024

(22) Filed: May 22, 2020

(65) Prior Publication Data

US 2020/0373859 A1   Nov. 26, 2020

Related U.S. Application Data

(60) Provisional application No. 62/852,086, filed on May 23, 2019.

(51) Int. Cl.
*H02N 2/18* (2006.01)

(52) U.S. Cl.
CPC .................. *H02N 2/186* (2013.01)

(58) Field of Classification Search
CPC ...... H02N 2/186; H02N 2/043; H01L 41/113; H01L 41/125
USPC .................. 310/339, 800; 290/1 R
See application file for complete search history.

(56) References Cited

U.S. PATENT DOCUMENTS

| 2008/0100178 A1* | 5/2008 | Clingman | H02N 2/18 310/330 |
| 2010/0096949 A1* | 4/2010 | Xu | H01L 41/0986 310/332 |
| 2011/0156533 A1* | 6/2011 | Morris | H02N 2/188 310/323.01 |
| 2012/0119620 A1* | 5/2012 | Xu | H02N 2/043 310/328 |

* cited by examiner

*Primary Examiner* — Charles Reid, Jr.
(74) *Attorney, Agent, or Firm* — Michael D. Eisenberg

(57) ABSTRACT

A frame for an energy transducer device for generating electrical current, the frame being a single monolithic structure including a pressure receiver unit, a first arm and a second arm joined to respective lateral sides of the pressure receiver unit, a first attachment unit joined to the second end of the first arm, and a second attachment unit joined to the second end of the second arm. The frame is configured to be joined to a current generating unit, such that the first attachment unit is joined to a first edge of the current generating unit while the second attachment unit is joined to second edge of the current generating element. An external force applied at the pressure receiver unit of the frame causes the frame to deform and thereby change the mechanical strain of the current generating element.

21 Claims, 18 Drawing Sheets

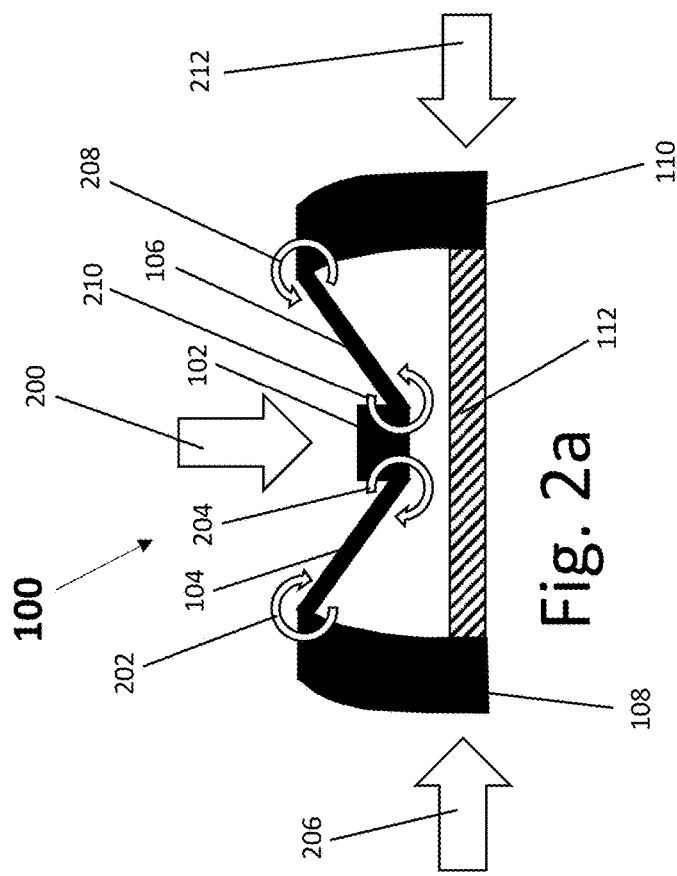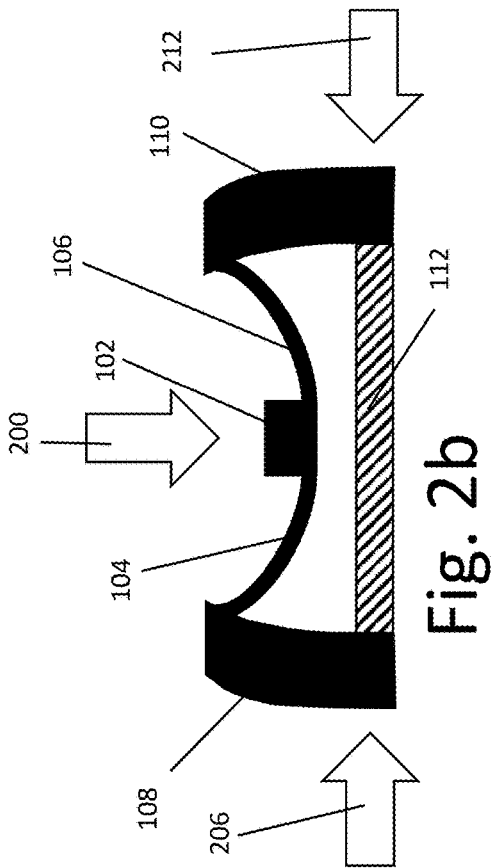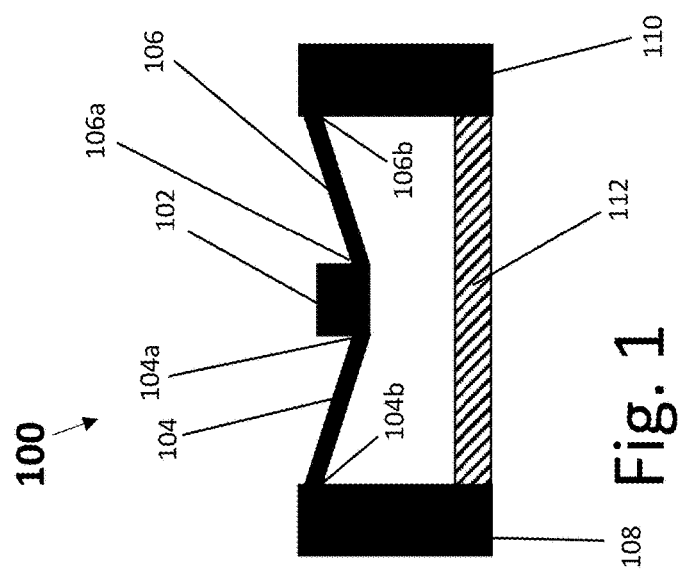

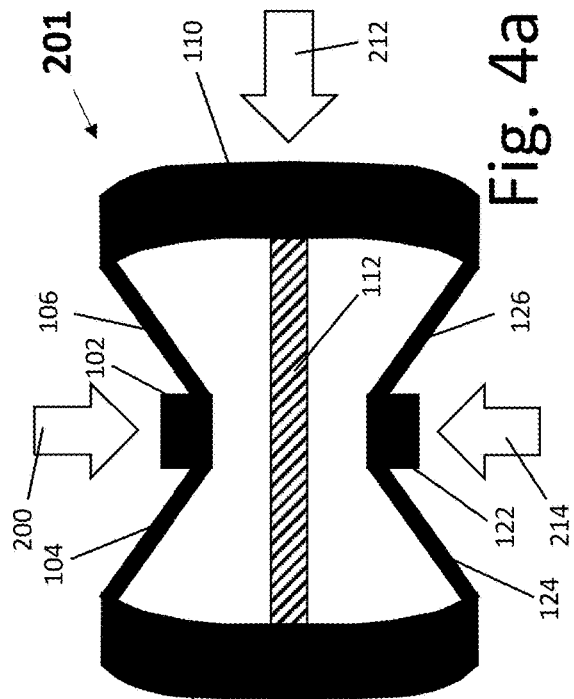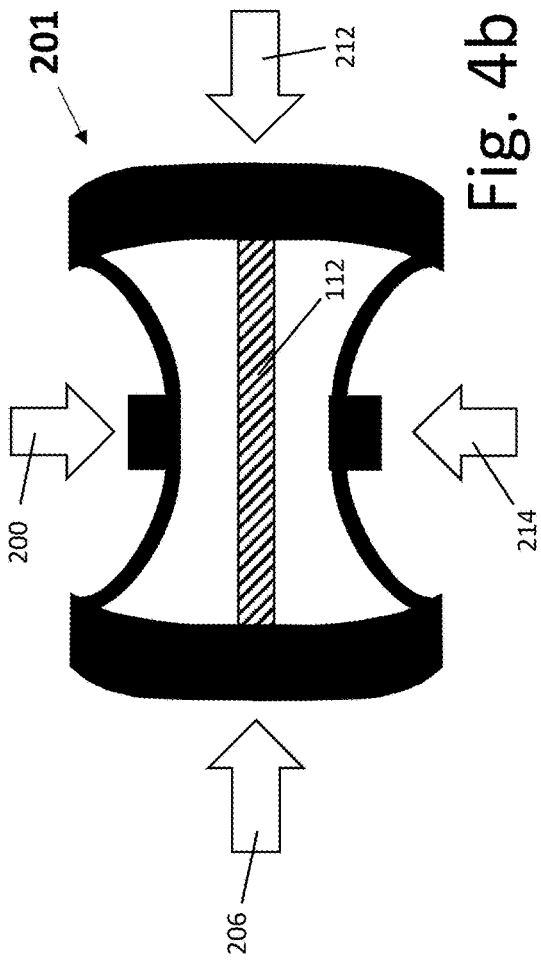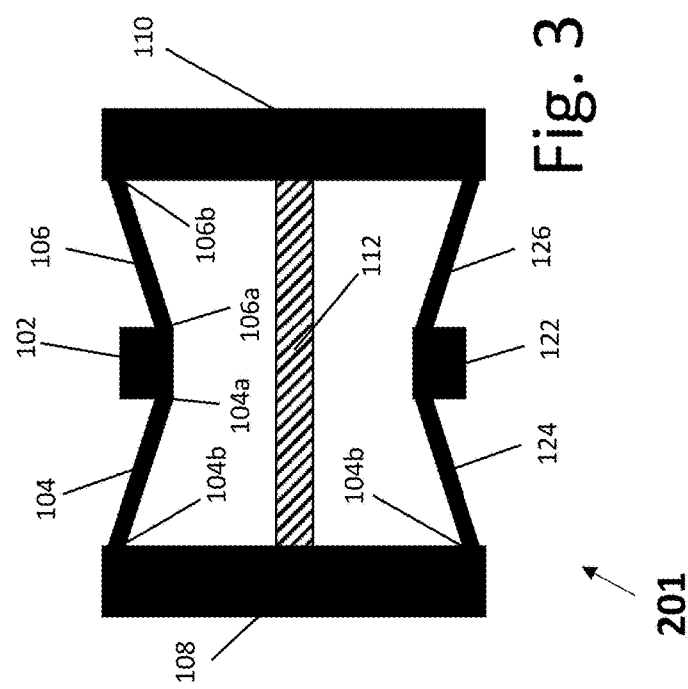

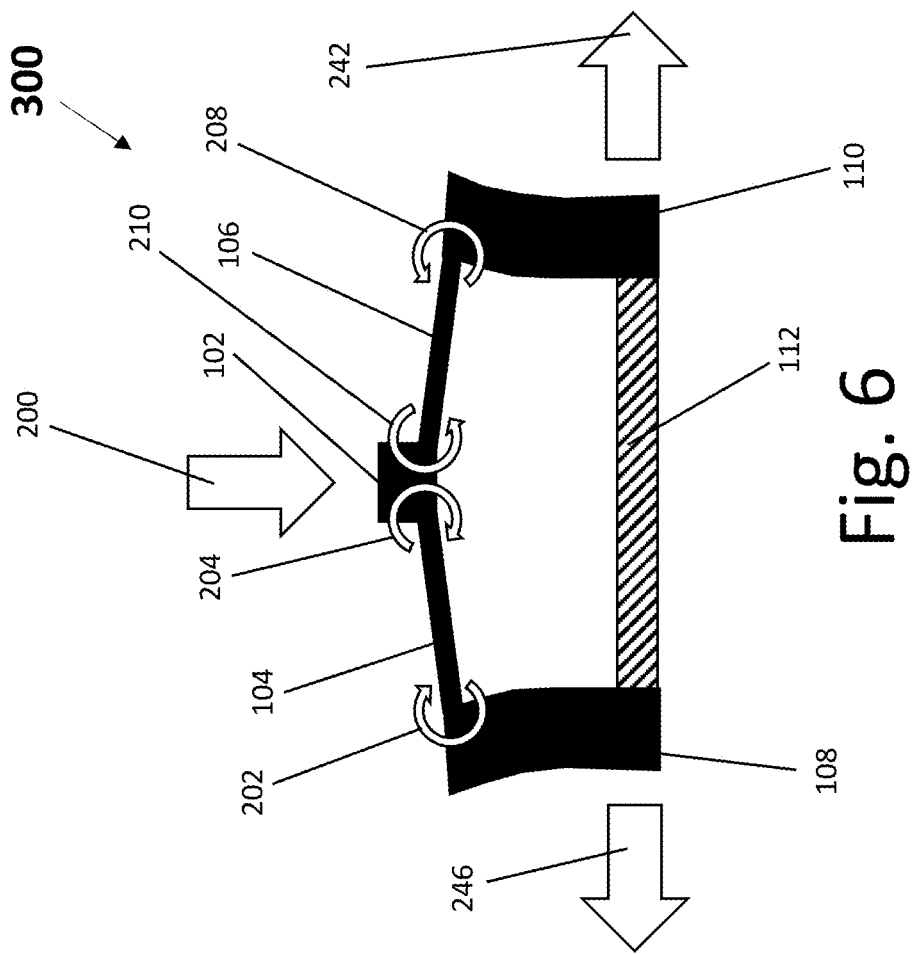
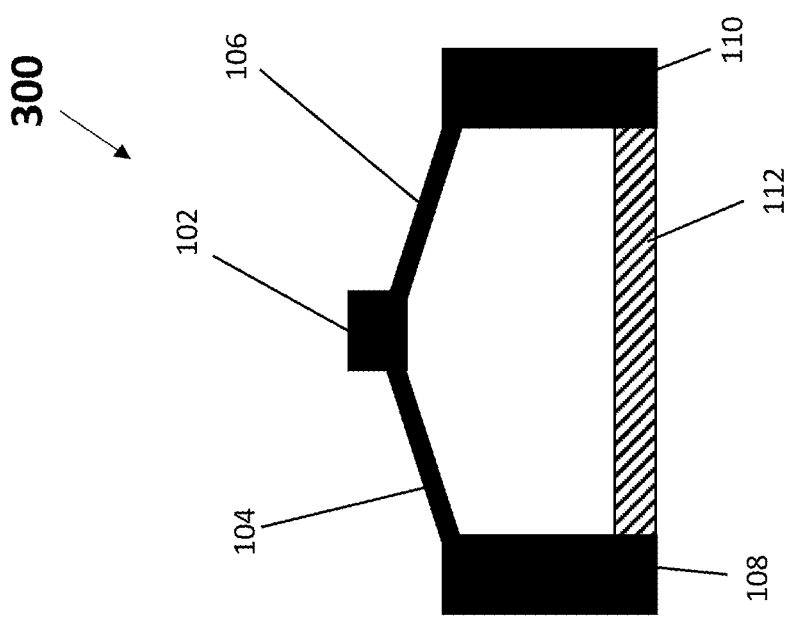

STRAIN-RELIEVED COMPLIANT STRUCTURES FOR FLEXTENSIONAL TRANSDUCTION

CROSS-REFERENCES TO RELATED APPLICATIONS

This application claims priority from U.S. Provisional Application Ser. No. 62/852,086 filed May 23, 2019, which is hereby incorporated herein by reference in the respective in its entirety.

TECHNICAL FIELD

This invention relates to an apparatus and method for solid-state transduction. More particularly, this invention relates to the conversion of mechanical energy into electrical energy through specific implementations of compliant structures and the mechanism thereof for improving the bandwidth, efficiency, reliability, and consistency of solid-state transducers.

BACKGROUND OF THE INVENTION

An electromechanical transducer is a device that converts mechanical energy to electrical energy. Application areas include accelerometers, flow sensors, linear motors, pressure sensors, hearing aid, hydrophones/sonars/speakers, and ultrasonic cleaners, internet-of-things, and power generation from mechanical vibrations. Electromechanical transducers comprise mechanisms that convert a change in material strain directly into changes in electrical or magnetic field, and in reverse can convert changes in electrical or magnetic field into material strain. Transducers of the former type are typically referred to as a generator and the latter type is a motor or an actuator.

For magnetic solid-state transduction, piezomagnetic and magnetostrictive materials are characterized by a coupling between the magnetic polarization and mechanical strain. The piezomagnetic coupling is a first order coupling effect, therefore having a substantially linear relationship between field and strain, whereas the magnetostrictive coupling is a second order coupling. For example, one material that exhibits both piezomagnetic and magnetostrictive behavior is known by those in the art as Galfenol, which is an iron-gallium alloy. Galfenol is a magnetic smart material that responds to external stresses by changing its magnetic state. These changes in magnetic state can induce voltage in a pick-up coil according to electromechanical induction. The voltage can then be converted to useful power. Similarly, changing an externally applied magnetic field can yield mechanical strain on Galfenol.

For electric solid-state transduction, piezoelectric and electrostrictive solid-state materials are characterized by a coupling between the electric polarization and mechanical strain. Piezoelectric coupling is a first order coupling effect, therefore having a linear relationship between field and strain, whereas the electrostrictive coupling is a second order coupling. For example, in materials such as lead zirconate titanate (PZT), piezoelectricity is a property of matter which represents the ability of certain crystalline materials to develop an electrical charge proportional to an applied mechanical stress. The converse effect can also be seen in these materials where strain is developed proportional to an applied electrical field.

Bimorph piezoelectric sensors produce a voltage in response to the application of a bending force (Olney, U.S. Pat. No. 5,934,882).

Rolt (U.S. Pat. No. 4,932,008) describes a hinged modified flextensional transducer as a means to reduce mechanical strain on the flextensional casing as a means to reduce resonance of the acoustic transducer.

Osborn et al. (U.S. Pat. No. 6,643,222) discloses a wave flextensional shell for a transduction driver as a means to reduce the mechanical stress.

Xu et al. (U.S. Pat. No. 9,048,759) discloses a piezoelectric energy harvesting device that includes an flextensional casing. The function of said casing is to amplify the input force and convert a greater fraction of mechanical energy into electrical energy.

BRIEF SUMMARY OF EMBODIMENTS OF THE INVENTION

The inventor has found that in the biomorph devices described in Olney, the amount of the voltage signal that can be harvested is limited to the applied force. Additionally, bending causes fatigue of the piezoelectric material, thus shortening its lifetime.

Moreover, in Rolt, the weakness in the art pertains to the difficulty of manufacturing tight-tolerance parts that form the sliding hinge. Such difficulty would be exacerbated in small sized transducer that requires small hinge components at the same dimensional tolerance.

In Osborn, one shortcoming is the only use of a slender wave geometry consisting of three distinctive sections. Other geometries such as having more numerous wave sections or those with difference cross-section geometries were not disclosed for relieving the stress of a compliance hinge. Furthermore, the disclosed art did not mention the differences between tensile and flexure strengths in a wave flextensional geometry subjected to deformation. Addressing and distinguishing the means of transferring motion or energy is an important aspect of a compliant flextensional transducer.

In Xu, the mechanical strain experienced by the casing would be extremely large for its ability to transfer or transform motion. The associated strain energy stored in the casing material would therefore take away and limit the amount of mechanical energy converted into electrical energy. The large strain whose repeat effect is material fatigue further limits the reliability of the disclosed art.

To address some of the shortcoming of the general art, some aspects of the present invention relate to the use of compliant structure, which consists of the so-called flextensional structures. Like other mechanisms, such as the conventional rigid-link or movable joints, compliant mechanisms are also used to transfer or transforms motion, force, or energy. The difference is that compliant mechanisms gain some of their mobility from the deflection of flexible members and material hinge. Unlike movable joints, some strain energy is stored as the elastic strain energy inside a compliant structure during deformation.

The advantages of compliant mechanism over rigid link as a means to transfer motion and energy are numerous. These advantages include low part-count, reduced transducer time, and simplified manufacturing processes. The use of compliant mechanisms also improves performance through increased precision, increased reliability, reduced wear, reduced weight, and reduced maintenance. Moreover, the use of compliant hinges as opposed to sliding hinges does not limit the manufacturing capability or transducer performance at small dimensions. In some embodiments of the present invention, the use of compliant mechanisms allows the transfer of strain energy without bending the piezoelectric or the piezomagnetic element, or, henceforth, the piezo element. Only uniaxial stress, i.e., pressure, is required, thereby greatly improves reliability of the solid-state transducer.

A novel combination of the advantages of a compliant mechanism with those of solid-state electro-active materials would enable more efficient, reliable, and consistent energy transduction than is known in the general art. Furthermore, the systems, devices, and methods comprise a number of distinguishing advantages, including, but not limited to: generating a greater material strain through mechanical leverage; reducing the mechanical resonant frequency of said systems, devices, and methods; and broadening the dynamic response or the frequency bandwidth of said systems, devices, and methods to the range of frequencies of the external excitation. A further advantage provided by embodiments of the systems, devices, and method described herein include provisions of a system consisting of self-repeating units of piezo units in a manner that further improves performance as describe herein. These and other advantages of one or more aspects will become apparent from a consideration of the ensuing description and accompanying drawings.

Therefore, an aspect of some embodiments of the present invention relates to a frame for an energy transducer device for generating electrical current. The frame includes a first pressure receiver unit, a first arm and a second arm, a first attachment unit, a second attachment unit. The first attachment unit is joined to the second end of the first arm. The second attachment unit is joined to the second end of the second arm. The first pressure receiver unit, the first arm, the second arm, the first attachment unit, and the second attachment unit form a single monolithic frame. The frame is configured to hold a current generating element having a first edge and a second edge, the first attachment unit being configured to be joined to the first edge and the second attachment unit being configured to be joined to the second edge. The current generating element comprising at least one of: a piezoelectric element, configured to change an electric polarization thereof when a mechanical strain thereof is changed, a change in the corresponding electric field being transformable into electrical current in a closed circuit; and a piezomagnetic element, configured to change magnetic polarization thereof when a mechanical strain thereof is changed, a change in the corresponding magnetic field being transformable into electrical current via an inductance coil. An external force applied at the first pressure receiver unit causes the first pressure receiver unit to move toward or away from the current generating element, thereby causing the first arm and the second arm to rotate in opposite directions with respect to the first pressure receiver unit and in opposite directions with respect to the first attachment unit and second attachment unit, respectively, thus applying first forces in different directions to the respective attachment units, causing the respective attachment units to apply second forces in different directions to the respective edges of the current generating element, thereby changing the mechanical strain of the current generating element.

In a variant, the current generating element extends along a first axis, such that the first edge and the second edge are located at respective locations along the first axis. The second forces applied to the respective edges of the current generating element by the respective attachment units are in opposite directions along the first axis, thereby changing the strain of the current generating element uniaxially along the first axis.

In another variant, the first arm and the second arm have equal lengths, and a projection of the first pressure receiver unit on the current generating element falls on a midpoint between the first edge and the second edge, such that the external force on the first pressure receiver unit causes the second forces to be equal in magnitude to each other.

In some embodiments of the present invention, the frame includes a second pressure receiver unit, and a third arm and a fourth arm, each having a respective third end and a respective fourth end, the third end of the third arm being joined to a first lateral side of the second pressure receiver unit and the third end of the fourth arm being joined to a second lateral side of the second pressure receiver unit. The fourth end of the third arm is joined to the first attachment unit. The fourth end of the fourth arm is joined to the second attachment unit. A second external force applied at the second pressure receiver unit causes the second pressure receiver unit to move toward or away from the current generating element, thereby causing the third arm and the fourth arm to rotate in opposite directions with respect to the second pressure receiver unit and in opposite directions with respect to the first attachment unit and second attachment unit, respectively, the third and fourth arms thus applying third forces in different directions to the respective attachment units, causing the respective attachment units to apply fourth forces in different directions to the respective edges of the current generating element, thereby changing the mechanical strain of the current generating element. The first pressure receiver unit, the first arm, the second arm, the second pressure receiver unit, the third arm, the fourth arm, the first attachment unit, and the second attachment unit form a single monolithic frame.

In a variant, the current generating element extends along a first axis, such that the first edge and the second edge are located at respective locations along the first axis. The second pressure receiver unit is positioned symmetrically opposite the first pressure receiver unit with respect to the first axis. The third arm is positioned symmetrically opposite the first arm with respect to the first axis. The fourth arm is positioned symmetrically opposite the second arm with respect to the first axis.

In another variant, the third arm and the fourth arm have equal length, and a projection of the second pressure receiver unit on the current generating element falls on a midpoint between the first edge and the second edge, such that the second external force on the second pressure receiver unit causes the fourth forces to be equal in magnitude to each other.

According to some embodiments of the present invention, each of the arms is corrugated, having a wavy shape between the respective first end and the second end.

In a variant, the first arm has a first central portion that is thicker than the first end of the first arm and the second end of the first arm, such that motion of the first pressure receiver unit toward and away from the current generating element cause rotation of the first arm with respect to the first pressure receiving unit about the first end of the first arm and rotation of the first arm with respect to the first attachment unit about the second end of the first arm. The second arm has a second central portion that is thicker than the first end of the second arm and the second end of the second arm, such that motion of the first pressure receiver unit toward and away from the current generating element cause rotation of the second arm with respect to the first pressure receiver unit about the first end of the second arm and rotation of the second arm with respect to the second attachment unit about the second end of the second arm.

In another variant, the first pressure receiving element is thicker than first arm than the second arm, the first attachment unit is thicker than the first arm, and the second attachment unit is thicker than the second arm.

In yet another variant, the first arm has a first groove traversing the first arm and extending between the first end of the first arm and the second end of the first arm. The second arm has a second groove traversing the second arm and extending between the first end of the second arm and the second end of the second arm.

In a further variant, a shape formed by the first arm, the first pressure receiver unit, and the second arm is convex at rest, such that a distance between the first pressure receiver and the current generating element is larger than a distance between the second end of the first arm and the current generating element and larger than a distance between the second end of the second arm and the current generating element, such that the motion of the first pressure receiver unit towards the current generating element causes the second forces applied on the current generating element point away from the current generating element.

In yet a further variant, a shape formed by the first arm, the first pressure receiver unit, and the second arm is concave at rest, such that a distance between the first pressure receiver and the current generating element is smaller than a distance between the second end of the first arm and the current generating element and larger than a distance between the second end of the second arm and the current generating element, such that the motion of the first pressure receiver unit towards the current generating element causes the second forces applied on the current generating element point toward to the current generating element.

Another aspect of some embodiments of the present invention relates to a device for generating electrical current, the device comprising the frame described above and the current generating element described above.

In a variant, the current generating elements is pre-strained when the frame is at rest.

In another variant, the device comprises at least one spacer located between the first attachment unit and the first end of the current generating element. The frame has a first coefficient of thermal expansion. The current generating element has a second coefficient of thermal expansion. The spacer has a third coefficient of thermal expansion, such that the difference between a first temperature dependent size change of the frame and a second temperature dependent size change of the current generating element is at least partially compensated by a third temperature dependent size change of the spacer, within a predetermined range of temperatures.

Another aspect of some embodiments of the present invention relates to a device for generating electrical current. The device comprises a first pressure receiver unit, a first arm and a second arm, a first attachment unit, a second attachment unit, a current generating element, a second pressure receiver unit, a third arm and a fourth arm. The first arm and the second arm each have a respective first end and a respective second end, the first end of the first arm being joined to a first lateral side of the first pressure receiver unit and the first end of the second arm being joined to a second lateral side of the first pressure receiver unit. The first attachment unit is joined to the second end of the first arm. The second attachment unit is joined to the second end of the second arm. The current generating element has a first edge and a second edge, the first edge being joined to the first attachment unit and the second edge being joined to the second attachment unit, the current generating element comprising one of: a piezoelectric element, configured to change an electric polarization thereof when a mechanical strain thereof is changed, a change in the corresponding electric field being transformed into electrical current in a closed circuit; and a piezomagnetic element, configured to change a magnetic polarization thereof when a mechanical strain thereof is changed, a change in the corresponding magnetic field being transformable into electrical current via an inductance coil. The third arm and the fourth arm each have a respective third end and a respective fourth end, the third end of the third arm being joined to a first lateral side of the second pressure receiver unit and the third end of the fourth arm being joined to a second lateral side of the second pressure receiver unit, the fourth end of the third arm being joined to the first attachment unit, and the fourth end of the fourth arm being joined to the second attachment unit. A first external force applied at the first pressure receiver unit causes the first pressure receiver unit to move toward or away from the current generating element, thereby causing the first arm and the second arm to rotate in opposite directions with respect to the first pressure receiver unit and in opposite directions with respect to the first attachment unit and second attachment unit, respectively, thus applying first forces in different directions to the respective attachment units, causing the respective attachment units to apply second forces in different directions to the respective edges of the current generating element, thereby changing the mechanical strain of the current generating element. A second external force applied at the second pressure receiver unit causes the second pressure receiver unit to move toward or away from the current generating element, thereby causing the third arm and the fourth arm to rotate in opposite directions with respect to the second pressure receiver unit and in opposite directions with respect to the first attachment unit and second attachment unit, respectively, the third and fourth arms thus applying third forces in different directions to the respective attachment units, causing the respective attachment units to apply fourth forces in different directions to the respective edges of the current generating element, thereby changing the mechanical strain of the current generating element. The first pressure receiver unit, the first arm, the second arm, the second pressure receiver unit, the third arm, the fourth arm, the first attachment unit, and the second attachment unit form a single monolithic frame.

In a variant, the current generating element extends along a first axis, such that the first edge and the second edge are located at respective locations along the first axis. The second pressure receiver unit is positioned symmetrically opposite the first pressure receiver unit with respect to the first axis. The third arm is positioned symmetrically opposite the first arm with respect to the first axis. The fourth arm is positioned symmetrically opposite the second arm with respect to the first axis.

In another variant, the first arm and the second arm have equal lengths, and a first projection of the first pressure receiver unit on the current generating element falls on a midpoint between the first edge and the second edge, such that the pressure on first pressure receiver unit causes the second forces to be equal in magnitude to each other. The third arm and the fourth arm have equal length, and a second projection of the second pressure receiver unit on the current generating element falls on the midpoint between the first edge and the second edge, such that pressure on the second pressure receiver unit causes the fourth forces to be equal in magnitude to each other.

In yet another variant, a first shape formed by the first arm, the first pressure receiver unit, and the second arm is convex at rest, such that a distance between the first pressure receiver unit and the current generating element is larger than a distance between the second end of the first arm and the current generating element and larger than a distance between the second end of the second arm and the current generating element, such that the motion of the first pressure receiver unit towards the current generating element causes the second forces applied on the current generating element point away from the current generating element. A second shape formed by the third arm, the second pressure receiver unit, and the fourth arm is convex at rest, such that a distance between the second pressure receiver unit and the current generating element is larger than a distance between the fourth end of the third arm and the current generating element and larger than a distance between the fourth end of the fourth arm and the current generating element, such that the motion of the second pressure receiver unit towards the current generating element causes the fourth forces applied on the current generating element point way from the current generating element.

In a further variant, a first shape formed by the first arm, the first pressure receiver unit, and the second arm is concave at rest, such that a distance between the first pressure receiver unit and the current generating element is smaller than a distance between the second end of the first arm and the current generating element and smaller than a distance between the second end of the second arm and the current generating element, such that the motion of the first pressure receiver unit towards the current generating element causes the second forces applied on the current generating element point toward the current generating element. A second shape formed by the third arm, the second pressure receiver unit, and the fourth arm is concave at rest, such that a distance between the second pressure receiver unit and the current generating element is smaller than a distance between the fourth end of the third arm and the current generating element and smaller than a distance between the fourth end of the fourth arm and the current generating element, such that the motion of the second pressure receiver unit towards the current generating element causes the fourth forces applied on the current generating element point toward the current generating element.

In yet a further variant, the first arm has a first central portion that is thicker than the first end of the first arm and the second end of the first arm, such that motion of the first pressure receiver unit toward and away from the current generating element cause rotation of the first arm with respect to the first pressure receiving unit about the first end of the first arm and rotation of the first arm with respect to the first attachment unit about the second end of the first arm. The second arm has a second central portion that is thicker than the first end of the second arm and the second end of the second arm, such that motion of the first pressure receiver unit toward and away from the current generating element cause rotation of the second arm with respect to the first pressure receiver unit about the first end of the second arm and rotation of the second arm with respect to the second attachment unit about the second end of the second arm. The third arm has a third central portion that is thicker than the first end of the third arm and the second end of the third arm, such that motion of the second pressure receiver unit toward and away from the current generating element cause rotation of the third arm with respect to the second pressure receiving unit about the first end of the third arm and rotation of the third arm with respect to the first attachment unit about the second end of the third arm. The fourth arm has a fourth central portion that is thicker than the first end of the fourth arm and the second end of the fourth arm, such that motion of the second pressure receiver unit toward and away from the current generating element cause rotation of the fourth arm with respect to the second pressure receiver unit about the first end of the fourth arm and rotation of the fourth arm with respect to the second attachment unit about the second end of the fourth arm.

Another aspect of some embodiments of the present invention relates to a device for generating electrical current, comprising an outer frame, at least two inner frames, and at least two current generating elements. Each of the inner frames comprises: a first pressure receiver unit; a first arm and a second arm, each arm having a respective first end and a respective second end, the first end of the first arm being joined to a first lateral side of the first pressure receiver unit and the first end of the second arm being joined to a second lateral side of the first pressure receiver unit; a first attachment unit joined to the second end of the first arm; a second attachment unit joined to the second end of the second arm; a second pressure receiver unit; a third arm and a fourth arm, each having a respective third end and a respective fourth end, the third end of the third arm being joined to a first lateral side of the second pressure receiver unit and the third end of the fourth arm being joined to a second lateral side of the second pressure receiver unit, the fourth end of the third arm being joined to the first attachment unit, and the fourth end of the fourth arm being joined to the second attachment unit. The first pressure receiver unit, the first arm, the second arm, the second pressure receiver unit, the third arm, the fourth arm, the first attachment unit, and the second attachment unit form a first single monolithic frame. Each of the current generating element has a first edge and a second edge, the first edge being joined to the first attachment unit of a respective inner frame and the second edge being joined to the second attachment unit of the respective inner frame, the current generating element comprising one of: a piezoelectric element, configured to change an electric polarization thereof when a mechanical strain thereof is changed, a change in the corresponding electric field being transformed into electrical current in a closed circuit; and a piezomagnetic element, configured to change a magnetic field thereof when a mechanical strain thereof is changed, a change in the magnetic field being transformable into electrical current via an inductance coil. The outer frame comprises: a third pressure receiver unit; a fifth arm and a sixth arm, each having a respective first end and a respective second end, the first end of the fifth arm being joined to a first lateral side of the third pressure receiver unit and the first end of the sixth arm being joined to a second lateral side of the third pressure receiver unit; a third attachment unit joined to the second end of the fifth arm; a fourth attachment unit joined to the second end of the sixth arm; a fourth pressure receiver unit; a seventh arm and an eighth arm, each having a respective third end and a respective fourth end, the third end of the seventh arm being joined to a first lateral side of the fourth pressure receiver unit and the third end of the eighth arm being joined to a second lateral side of the fourth pressure receiver unit, the fourth end of the seventh arm being joined to the third attachment unit, and the fourth end of the eighth arm being joined to the fourth attachment unit. The third pressure receiver unit, the fifth arm, the sixth arm, the fourth pressure receiver unit, the seventh arm, the eighth arm, the third attachment unit, and the form attachment unit form a second single monolithic frame. The inner frames are disposed in sequence, such that the second pressure receiver unit of one of the inner frames contacts the first pressure receiver unit of a subsequent inner frame. The sequence of inner frames is placed inside the outer frame, so that the first pressure receiver unit of a first inner frame of the sequence is attached to the third attachment unit of the outer frame, and the second pressure receiver unit of a last inner frame of the sequence is attached the fourth attachments unit of the outer frame. A first external force applied at the third pressure receiver unit causes the third pressure receiver unit to move toward or away from the sequence of inner frames, thereby causing the fifth arm and the sixth arm to rotate in opposite directions with respect to the third pressure receiver unit and in opposite directions with respect to the third attachment unit and fourth attachment unit, respectively, thus applying first forces in different directions to the respective attachment units. A second external force applied at the fourth pressure receiver unit causes the fourth pressure receiver unit to move toward or away from the sequence of inner frames, thereby causing the seventh arm and the eighth arm to rotate in opposite directions with respect to the third pressure receiver unit and in opposite directions with respect to the third attachment unit and fourth attachment unit, respectively, thus applying second forces in different directions to the respective attachment units. The first forces and second forces cause the third attachment unit to apply a first secondary force on the first pressure receiver unit of the first inner frame of the sequence. The first forces and second forces cause the fourth attachment unit to apply a second secondary force on the second pressure receiver unit of the last inner frame of the sequence, thereby causing the first pressure receiver units and the second receiver units to move toward or away from the respective current generating elements, thereby causing the first arms and the second arms to rotate in opposite directions with respect to the respective first pressure receiver units and in opposite directions with respect to the respective first attachment units and second attachment units, respectively, and causing the third arms and the fourth arms to rotate in opposite directions with respect to the respective second pressure receiver units and in opposite directions with respect to the respective first attachment units and second attachment units, respectively, thus applying tertiary forces in different directions to the respective first and second attachment units, causing the respective first and second attachment units to apply quaternary forces in different directions to the respective edges of the respective current generating elements, thereby changing respective mechanical strains of the current generating elements.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

FIGS. 1 and 2 illustrate a concave device for generating electrical current in response of pressure applied on one pressure receiver unit, according to some embodiments of the present invention;

FIGS. 3 and 4 illustrate a concave device for generating electrical current in response of pressure applied on one or two pressure receiver units, according to some embodiments of the present invention;

FIGS. 5 and 6 illustrate a convex device for generating electrical current applied on one pressure receiver unit, according to some embodiments of the present invention;

Figure 8:
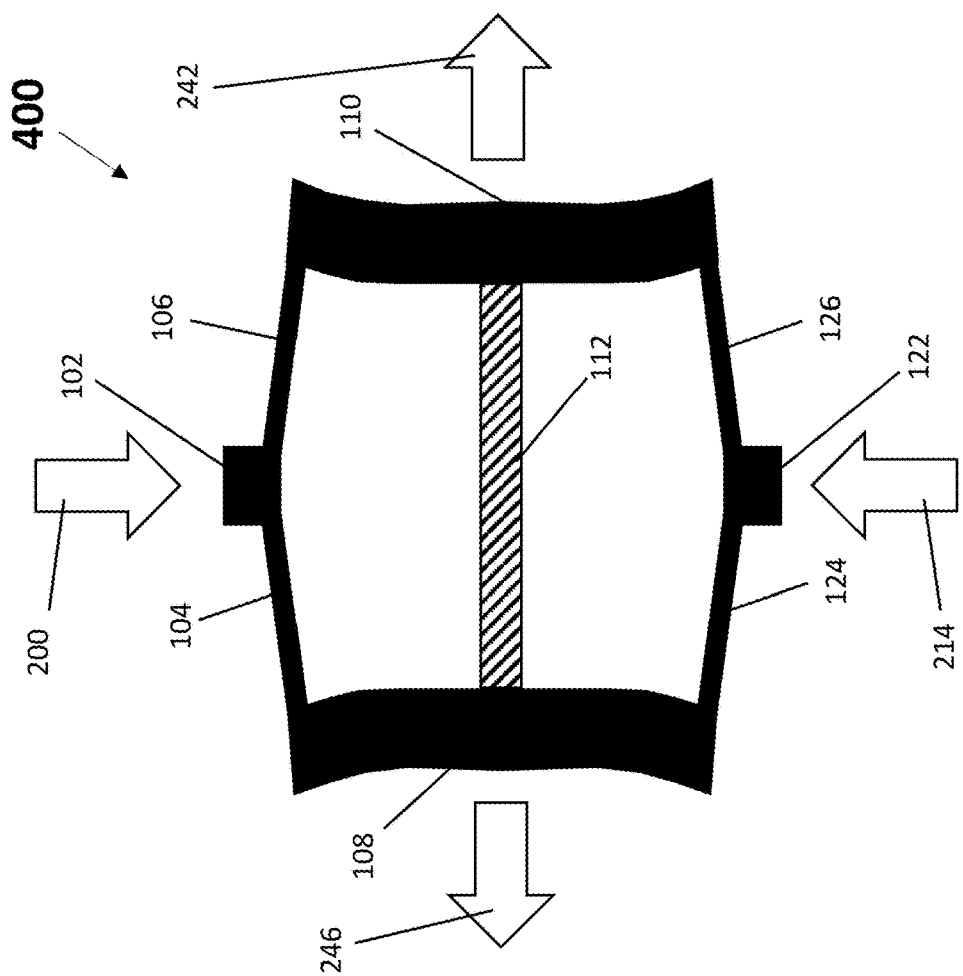
FIGS. 7 and 8 illustrate a convex device for generating electrical current in response of pressure applied on one or two pressure receiver units, according to some embodiments of the present invention.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

From time-to-time, the present invention is described herein in terms of example environments. Description in terms of these environments is provided to allow the various features and embodiments of the invention to be portrayed in the context of an exemplary application. After reading this description, it will become apparent to one of ordinary skill in the art how the invention can be implemented in different and alternative environments.

Unless defined otherwise, all technical and scientific terms used herein have the same meaning as is commonly understood by one of ordinary skill in the art to which this invention belongs. All patents, applications, published applications and other publications referred to herein are incorporated by reference in their entirety. If a definition set forth in this section is contrary to or otherwise inconsistent with a definition set forth in applications, published applications and other publications that are herein incorporated by reference, the definition set forth in this document prevails over the definition that is incorporated herein by reference.

Henceforth, the terminology 'piezo-electromagnetic material' or "piezo material" is used to describe a material that responds either electrically or magnetically to an applied mechanical force that causes a change in the mechanical strain of the material from a reference strain of the material. Strain is a description of the material's deformation in terms of relative displacement of particles in the body that excludes rigid-body motions. For piezo-electrical transduction, a change in mechanical strain, the piezo electric material generates a voltage polarity, which causes electrical current to flow in a contiguous closed circuit. For a magnetic response to a change in mechanical strain, a magnetic flux is changed inside the material and thereby changing the magnetic field in the surrounding environment. Given Faraday's laws of electromagnetism, the changing magnetic flux would induce an electrical current in a non-contiguous electrical coil when the coil is aligned axially to the direction of said changing magnetic flux lines. Such piezo electric or magnetic induction-based process of transduction provides a means of generating an electrical current in a closed electrical circuit. A description of the means below provides the method to improve the performance, reduce the cost, and increase the reliability of piezo based transduction.

Referring now to the drawings, FIGS. 1, 2a, and 2b illustrate a cross section of a concave device 100 for generating electrical current in response of pressure applied on one pressure receiver unit, according to some embodiments of the present invention. In FIG. 1 the device 100 is at a rest state, while in FIG. 2, pressure is externally applied to the device 100 and the device 100 is deformed.

The device 100 includes a frame and a piezo element 112. The frame includes a first pressure receiver unit 102, a first arm 104, a second arm 106, a first attachment unit 108, and a second attachment unit 110. The frame is a made of a single monolithic material, which is partially compliant. The magnitude of compliance is definable as the inverse of stiffness, which is commonly defined in engineering as the ratio of applied force to the resulting linear deformation of a material. Compliance is therefore definable by the linear deformation divided by force, in physical units such as millimeters per newton or inches per pound. At either extreme, a very rigid or a very soft structure will not efficiently transfer the strain energy from the pressure receiver unit 102 to the piezo element 112. Given that strain energy scales proportionally to compliance, a very rigid structure would provide insignificant strain change to element 112. Likewise, a highly compliant structure would exceed the material strain limit of the frame and reduces reliability. The geometry of the arms 104 and 106 is therefore within a desirable range of compliance to optimize transduction efficiency. In some embodiments, the compliance of the frame at the pressure receiver unit 102 is about 0.001 mm/Newton, which may be 2 to 200 times the compliance of the piezo-element 112. To those familiar in the art, compliance is the ratio between deformation and the applied force, corresponding to the inverse of stiffness. A more compliant object deforms more than less compliant object in response to the same applied stress/force. The desired range of compliance of the device 100 is discussed further below in this document.

In further detail, the range of allowable structural compliance of device 100 is set by the fatigue strain limit of the material forming the frame. To maximize reliability, compliance is set by the geometries of arms 104, 106 to a predetermined range based on the fatigue strain limit of the frame's material. In various aspects, the fatigue limit is typically definable as one-half of the elastic linear strain limit of the frame's material. With cyclic strains up to the fatigue limit, the molecular structure of the frame's material is expected to remain unchanged regardless of the manner in which the cyclic strain is applied. Keeping material deformation within the fatigue limit of a compliant structure would substantially increase the lifetime of the structure. Typically, materials such as steel or titanium have a linear elastic strain limit of 6 to 12 percent in proportion to length, beyond which permanent plastic deformation occurs for the material. As a result, the corresponding fatigue limit is half of the linear elastic strain limit and ranges between 3 to 6 percent. Therefore, the pressure receiver unit 102 could travel vertically up to 6 percent of the height of device 100 without causing (by itself) permanent plastic deformation occurring in the material.

The first arm 104 has a first end 104a joined to a first lateral side of the first pressure receiver unit 102 and a second end 104b joined to the first attachment unit 108. The second arm 106 has a first end 106a joined to a second lateral side of the first pressure receiver unit 102 (opposite the first lateral side) and a second end 106b joined to the second attachment unit 110. The first attachment unit 108 and the second attachment unit 110 are configured for being joined to a first edge and a second edge of the piezo element 112, respectively. The piezo element 112 may be joined to the frame in any known manner, for example via a fastener (e.g., screw/bolt), press fit, or a bonding agent (e.g., glue, epoxy, contact friction).

In the example of FIGS. 1-2b, the frame has a concave shape at rest state. In fact, the distance between the first pressure receiver element 102 and the piezo element 112 is smaller than the distance between the second end 104b of the first arm 104 and the piezo element 112 and smaller than the distance between the second end 106b of the second arm 106 and the piezo element 112.

As seen in FIGS. 2a and 2b, when an external force 200 is applied to the first pressure receiver unit 102 in the direction of the piezo element 112, the first pressure receiver unit 102 is pushed toward the piezo element 112. This causes the first arm 104 and the second arm 106 to rotate in opposite directions (FIG. 2a) and/or bend (FIG. 2b). In FIG. 2a, the first arm 104 rotates clockwise with respect to the first pressure receiver unit 102 (as shown by the curved arrow 204) and with respect to the first attachment unit 108 (as shown by the curved arrow 202), while the second arm 106 rotates counterclockwise with respect to the first pressure receiver unit 102 (as shown by the curved arrow 210) and with respect to the second attachment unit 110 (as shown by the curved arrow 208). In FIG. 2b, the arms 104 and 106 bend inwards, toward the piezo element 112.

The rotation and/or bending of the arms 104 and 106 causes the arms 104 and 106 to apply first forces to the attachment units 108 and 110, pulling the attachment unit 108 and 110 toward each other. Thus, the first attachment unit 108 applies a force 206 to the piezo element 112 in a first direction, while the second attachment unit 110 applies a force 212 to the piezo element 112 in a second direction. Therefore, the frame applies a compression force the piezo element and changes the strain of the piezo element. Such said forces would provide a compressional strain to the piezo element, in directions to the forces 206 and 212 as indicated in FIGS. 2a and 2b. To those versed in the art, an increase compressive strain corresponds to a positive increase in material strain. The change in strain of the piezo element 112 causes the piezo element 112 to respond by creating a voltage therethrough and/or changing a magnetic field/flux thereof, as explained above, allowing the flow of electrical current in a circuit associated with the piezo element 112.

In some embodiments of the present invention, the piezo element 112 is a straight element extending along an axis between the attachment units 108 and 110. In a variant, the forces 206 and 212 applied to the piezo element are in opposite directions along the axis, and therefore provide a means for uniaxial strain change to the piezo element. In this manner, the strain change does not cause the bending of the piezo element 112. As noted above, bending of the piezo element produces a non-uniform strain change of the piezo material, thus shortening its lifetime and reliability.

In some embodiments of the present invention, the first arm 104 and the second arm 106 have equal length. The first pressure receiver unit 102 is at a midpoint between the attachment units 108 and 110. A projection of the first pressure receiver unit 102 on an axis extending between the attachment unit 108 and 110 falls on the midpoint of the axis. A projection of the first pressure receiver unit 102 on the piezo element 112 falls on the midpoint between the first edge and second edge of the piezo element 112. In these embodiments, the forces 206 and 212 applied to the piezo element are equal in value and opposite in direction along the axis of the piezo element.

It should be noted that it is clear that in case the external force 200 is applied to the first pressure receiver unit 102 in the opposite direction (away from the piezo element), the deformation of the frame would cause the forces 206 and 212 to be in directions opposite to the directions seen in the drawings, pulling away from the center of the piezo element and applying an tensile force to the piezo element. Such said force would provide an tensile strain to the piezo element, in directions opposite to the forces 206 and 212 as indicated in FIGS. 2a and 2b. To those versed in the art, an increase tensile strain corresponds to a negative increase in material strain.

In some embodiments of the present invention, the piezo element 112 is under pre-strain when the frame is at rest, without any external forces applied to receiver unit 102. Thus, the level of pre-strain of the piezo element and the structural features of the frame may be configured such that the change of aforementioned forces 206 and 212 between compression forces and tensile forces would only cause a change in the magnitude of the strain of the piezo strain 112 without alternating the direction of the strain between a compression strain and an tensile strain. In other words, a relative strain of element 112 whose positive and negative values correspond to the direction of the external force 200 may have absolute strains with only positive or negative values.

In some aspect, piezo element 112 is under 0.15% pre-strain at rest, as will be explained further below. When a cyclic force is applied to receiver unit 102, the corresponding cyclic strain changes between 0.05% and 0.25% in compression. The advantage in this aspect is that piezo element 112 avoids tensile strain to improve reliability.

Referring to FIGS. 2a and 2b, in some embodiments of the present invention is configured to have 0.15% without an external force. In a next moment, the receiver unit 102 receives an impact force in a direction pushing towards element 112. The said force will produce a larger positive strain to element 112. In various aspects, the absolute compression strain reaches 0.25% from the initial 0.15% pre-strain. Alternatively, an impacting force pulling away from element 112 will produce a smaller positive strain to element 112. In various aspects, the positive strain reaches 0.05% from the initial 0.15% pre-strain. In both impact force scenarios, no negative absolute strains are produced in element 112. In cases where the pre-strain is zero, the alternating impact forces would produce 0.1% and −0.1% strains, respectively.

In some embodiments of the present invention, the external force 200 is a vibrating force that changes directions cyclically (for example, representative in time as a sinusoidal or a square waveform). Device 100 under such harmonic forcing may vibrate at resonance. The corresponding deformation alternates around zero for device 100. In such cases, a pre-strained element 112 in the positive direction (compressive strain) also vibrates at resonance and experiences a relative strain in equal magnitude but with alternating directions. Centered around a pre-strain value (for example, 0.1%), the absolute strain would remain positive regardless of the direction of the applied external forces. In cases in which the piezo element is not pre-strained when the device 100 is at rest, the deformation of the frame of the device 100 varies and would cause both tensile strain and compression strain to the piezo element at different times.

In some embodiments of the present invention, the first pressure receiving element 102 is thicker than the arms 104 and 106, the first attachment unit 108 is thicker than the first arm 104, and the second attachment unit 108 is thicker than the second arm 106. In this manner, the bending of the first pressure receiving element 102 due to the external force 200 is decreased, and the external force 200 is efficiently transferred to the arms 104 and 106. In the same manner, the bending of the attachment units 108 and 110 is decreased due to the thickness thereof, ensuring that the forces applied by the arms on the attachment units are efficiently transferred to the piezo element.

As mentioned above, the frame includes a monolithic material component that is produced in a single manufacturing process. In some embodiments of the present invention, the monolithic material is substantially rigid and strong to withstand bending. The geometry of the frame, however, provides low resistance at the ends of the arms by making the arms thinner at the ends, to enable bending at the ends of the arms, therefore allowing rotation of the arms with respect to the first pressure receiving element and with respect to the attachment units. Examples of materials for the frame include stainless steel, tempered steel, plastics, plastic composites, or other materials that have a Young's Modulus greater than 50 GPa.

In some embodiments of the present invention, the material selection for the frame provides benefits in the transduction efficiency, reliability, and consistency thereof. To fulfill such requirements, the frame may include titanium or low-carbon steel with high tensile strength and high fatigue strength to provide the means of generating higher strain to piezo element 112.

In some embodiments of the present invention, the device 100 is configured to be mounted contiguously to a vibrating base or platform, such that vibrations on the base or platform apply an external force to the first pressure received element 102, and cause the frame of the device 100 to deform as described above. In some embodiments, the vibrating base is an object that is excited to generate an audible sound, such as an antenna in water or flag pole in the wind. Sound is a change in air (aerodynamic) pressure or liquid (hydrokinetic) pressure, and the change of air or liquid pressure applied an external force to the pressure receiver element 102. In some embodiments, the vibrating base is a road surface made of asphalt, concrete, or other pavement types. The road surface vibrates when vehicles travel on the road. The vibrations of the road surface apply an external force to the first pressure receiver element 102 and therefore change the strain of piezo element 112, as explained above. In some embodiments, the device 100 is configured to be mounted to a moving system such as a shipping container or human/animal, or within a moving stream of liquid or gas such as on the tip of a wind turbine or an oil/gas pipeline. Vibrations caused by motion apply an external force to the first pressure receiver element 102 and therefore change the strain of the piezo element 112.

Depending on the external force applied to the first pressure receiver element, the frame of the device 100 deforms either intermittently, continuously, or at resonance. In detail, resonance deformation may occur when the resonant frequency of the device 100 is the same as the frequency of the vibration of the base to which the device 100 is joined.

In some embodiments of the present invention, the device 100 is configured to be mounted on a rigid body which is externally excited by another vibrating body. In a non-limiting example, the rate of vibrating frequency ranges from 5 to 500 Hz at 100-percent duty cycle. In further detail, duty cycle describes the intensity of the vibration in proportion to the ratio of active and inactive periods. As random vibrations of various sources are not self-repeating, the vibration is characterized by its averaged duty cycle in addition to amplitude and frequency. In another non-limiting example, device 100 receives vibrational energy in the frequency ranges from 1 to 100 Hz at 50 percent averaged duty cycle.

In another nonlimiting example, device 100 is configured to be mounted in the flow of either air or water, henceforth either medium as "fluid". The fluid flow could generate alternating forces to the pressure receiving unit 102. The alternating forces may originate from fluid instability both laminar and turbulent in nature. To those versed in the art, such laminar and turbulent flow regimes create instabilities that can cause either steady or unsteady forces on an object located in the flow of said fluid. In some embodiments. A fixture such as a rod or an antenna may be connected to the pressure receiving unit 102 as a means to increase the forces applied to the pressure receiving unit 102. In some embodiments, device 100 is mounted to a moving body such as a fish or a bird so that a fluid flow is generated across device 100. In various aspects, the flow is 0.1 to 10 meters per second and the generated force is between 1 to 30 Hz for a steady instability and a combination of frequencies of said range for an unsteady instability. For both steady and unsteady forces, the duty cycle could range between 20 to 100 percent as to appear as intermittent in said fluid flow.

It should be noted that the forces and strains exerted in the device 100 in response to the external force 200 are reversible. This is true both in a single instance scenario, in which the external force 200 is a one-time impact force (stretching impact), and in a continuous excitation scenario, in which the force 200 is cyclic. Thus, when the external force 200 is no longer exerted on the device 100, the device 100 returns to a rest configuration thereof. At the rest configuration of the device 100, the external force 200 is zero and all internal forces equal at the interfaces between the frame of the device 100 and piezo element 112. In some embodiments of the present invention, the rest configuration of the device 100 refers to a pre-loaded state in which the piezo element 112 is pre-strained, Thus, the piezo element and the frame of the device 100 may be pre-strained at rest. The rest configuration refers to state where the pressure receiver unit 102 experiences no external pressure.

In some embodiments, of the present invention, the external force 200 causes the first pressure receiving unit 102 to move between 0.2 and 2 millimeters and causes and a compression of the piezo element between 0.02 to 0.2 millimeters. In various aspects, the device 100 with a given compliance is driven by an impacting force with substantial magnitude to yield the aforementioned compression. In a non-limiting example, a structural compliance of 0.001 millimeter per Newton of force would require 200 Newtons to obtain 0.2 millimeter of travel of the first pressure receiving unit 102.

In a non-limiting example, the piezo element 112 may include a piece of piezoelectric ceramic, such as lead zirconate titanate or barium titanate. The piezo element may be made up of a multitude of stacking layers plated with interdigiting metal electrodes. Alternatively, the piezo element 112 may include a magnetostrictive material, such as terphenyl or galfenol, an iron-gallium alloy.

Figure 26:
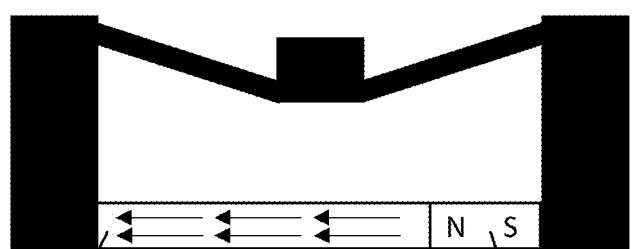
FIGS. 26-33 illustrate examples of the device of FIG. 1 with one or more permanent magnets attached to the frame, according to some embodiments of the present invention.
Figure 27:
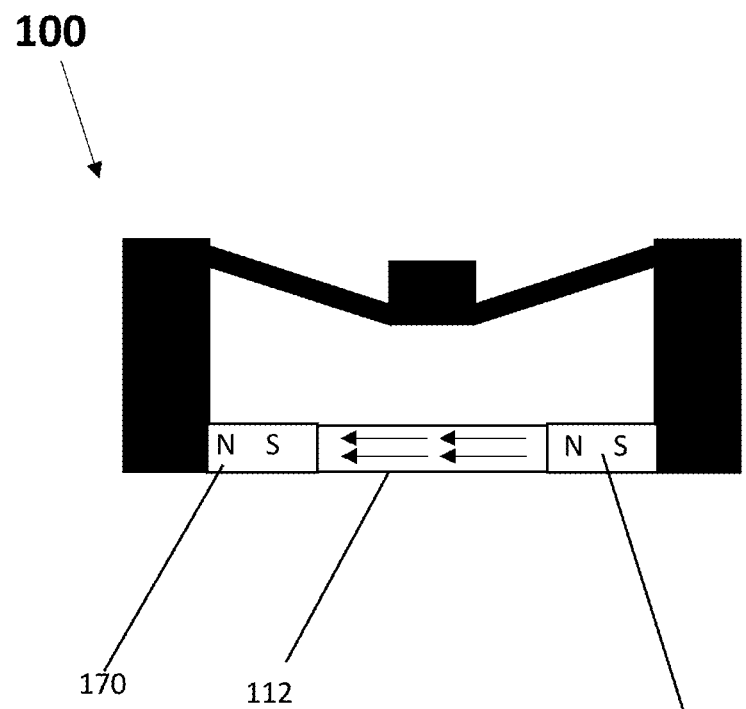

In reference to FIGS. 26-33, in some embodiments of the present invention, the piezo element 112 includes a magnetostrictive material and the device 100 includes at least one permanent magnet 170 to bias the magnetic polarization of the magnetostrictive material. A magnetic field is created by the magnet(s) 170 in the direction of the applied strain (generally along the length of the piezo element 112). The magnetic field lines are depicted by arrows in FIGS. 26-30. The magnitude of the said magnetic field corresponds to the strength of said magnet, typically measured in Tesla or Gauss. The strength of said magnet is chosen to enhance/increase the change in the magnetic polarization with respect to change in strain, thereby increasing magnetostrictive energy transduction. In some embodiments, the magnet(s) 170 is (are) located in contiguous contact with the frame of device 100 but not in contiguous contact to the piezo element 112, as seen for example in FIGS. 29-33. Due to this placement of said magnet, the magnet 170 does not receive forces from the strain during external excitation. In a non-limiting example, the magnets 170 are contiguous to another location of the frame as a means to minimize the total volume of device 100. In such embodiments, the material arrangements do not affect the stress-strain relationship between receiver 102 and piezo element 112 of the embodiments as described herein. In other examples, the one or more magnets 170 are placed in contiguous contact with piezo element 112, as seen in FIGS. 26 and 27, and thereby receive forces from the frame of device 100. In all embodiments, the magnet 170 is placed to decrease the loss of magnetic flux between the said magnet 170 and piezo element 112 and to increase the magnetic field exerted on the piezo element 112. In such embodiments, the material arrangements do affect the stress-strain relationship between receiver 102 and element 112 of the embodiments as described herein.

Figure 29:
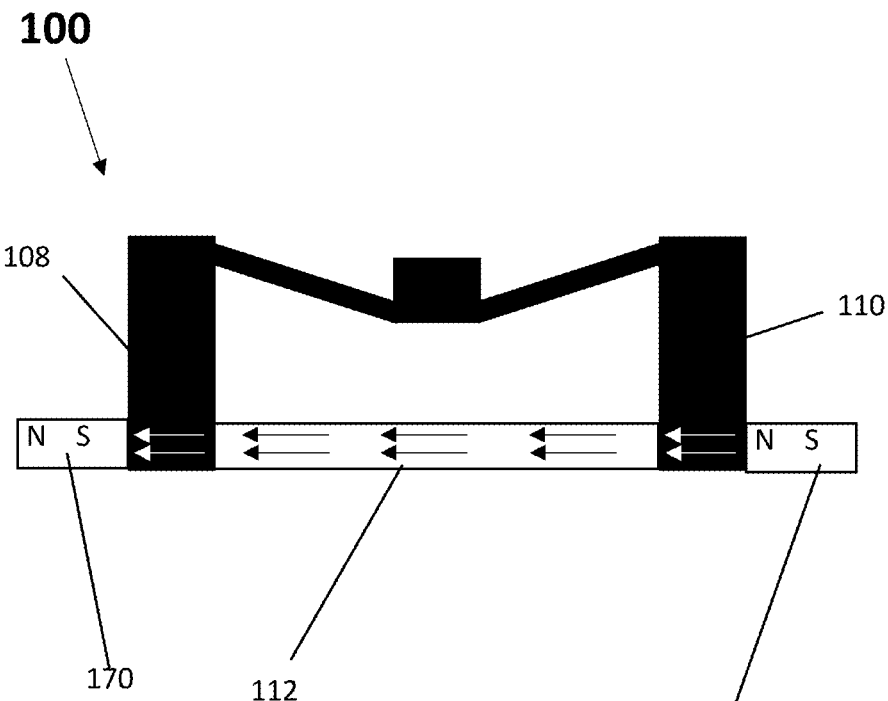

In a non-limiting example, the one or more permanent magnets extend along the longitudinal axis of the piezo element 112 (as shown in FIGS. 26, 27, and 29). In some embodiments of the present invention, two magnets 170 are joined to the piezo element, each magnet being joined to a respective end of the piezo element, as shown in FIG. 27. The North pole of the first magnet 170 is joined to the first end of the piezo element 112, while the South pole of the second magnet 170 is joined to second end of the piezo element to form a magnetic chain. In some embodiments of the present invention, two magnets 170 are joined to the frame in close proximity to the ends of the piezo element 112, each magnet being joined to a side of the frame in close proximity to a respective end of the piezo element, as shown in FIG. 29. The North pole of the first magnet 170 is joined to a first side of the frame (e.g., first attachment unit 108) near the first end of the piezo element 112, while the South pole of the second magnet 170 is joined to a second side of the frame (e.g., second attachment unit 110) near the second end of the piezo element 112.

Figure 28:
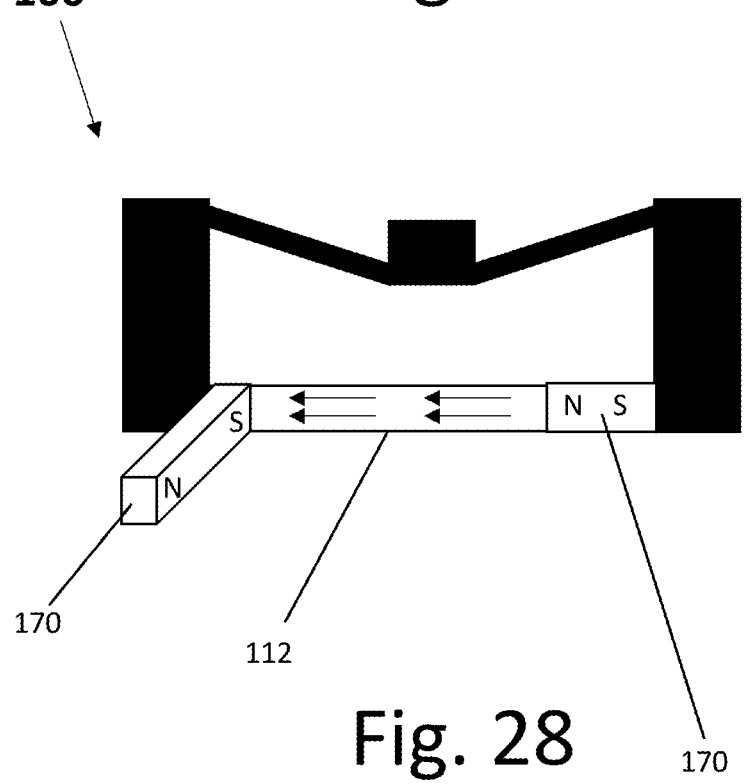

In another non-limiting example, the magnet(s) 170 does (do) not extend along longitudinal axis of the piezo element and/or may have a non-linear shape (as shown in FIGS. 28 and 30-33). This latter example is applicable when the piezo material 112 is metallic, as joining a permanent magnet to a metallic piezo element causes the metallic piezo element to become part of the magnetic chain and causes the magnetic field lines inside the metallic piezo element to follow the length of the metallic piezo element. In some embodiments of the present invention, two magnets 170 are joined to the piezo element, each magnet being joined to a respective end of the piezo element, as shown in FIG. 28. The North pole of the first magnet 170 is joined to the first end of the piezo element 112, while the South pole of the second magnet 170 is joined to second end of the piezo element to form a magnetic chain.

Figure 30:
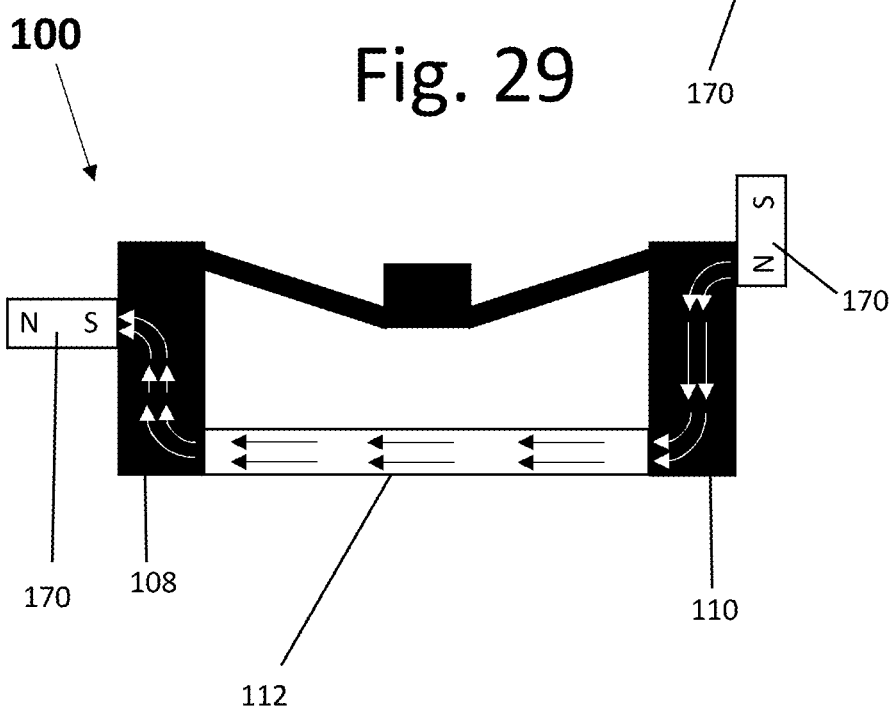
Figure 31:
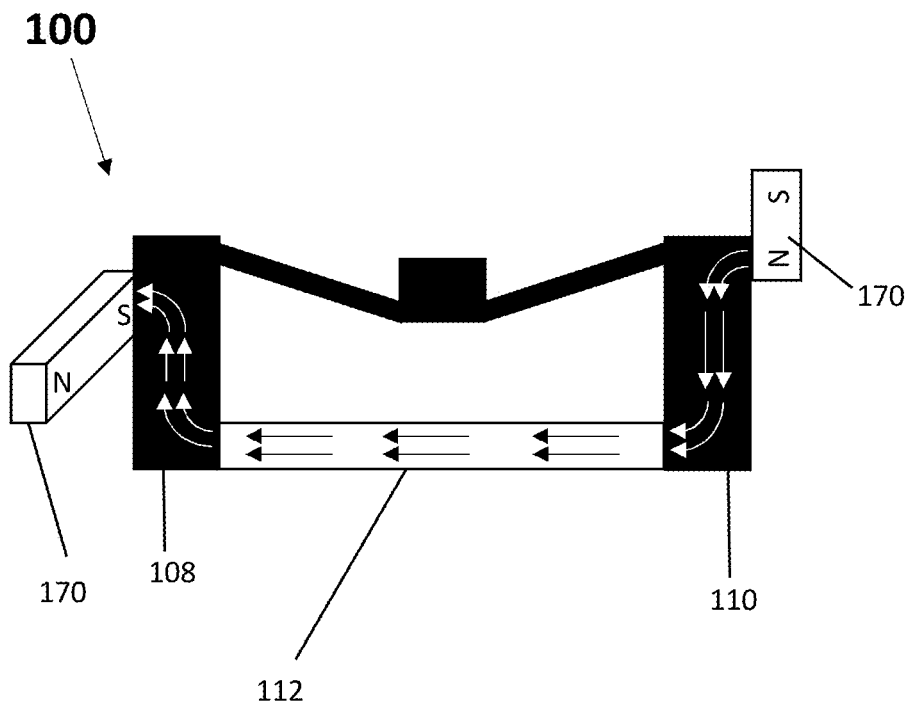

If the magnet(s) 170 is (are) joined to the frame, but not to the piezo element 112, the magnet(s) 170 need not extend along the longitudinal axis of the piezo element if the frame and the piezo element 112 are both metallic. This is because the frame and the piezo element become part of the magnetic chain when the magnet(s) is (are) joined to the frame, causing the magnetic field lines to follow the length of the piezo element. In some embodiments of the present invention, two magnets 170 are joined to opposite sides of the frame at different ends of the piezo element, such that the North pole of the first magnet is joined to one side (e.g., the first attachment unit 108) of the frame and the South pole of the first magnet is joined to the other side (e.g., second attachment unit 110) of the frame, as seen in FIGS. 30 and 31.

Figure 32:
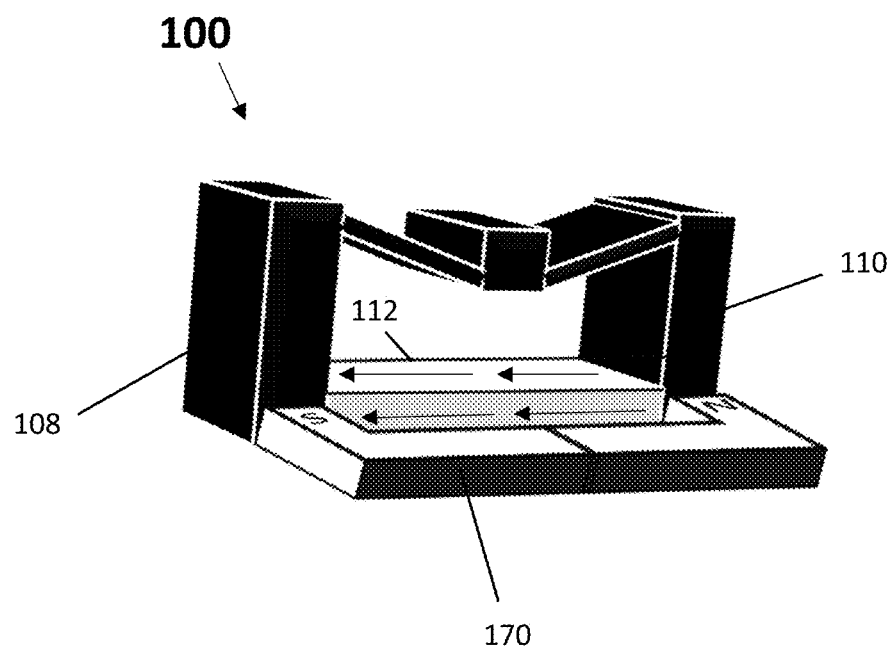
Figure 33:
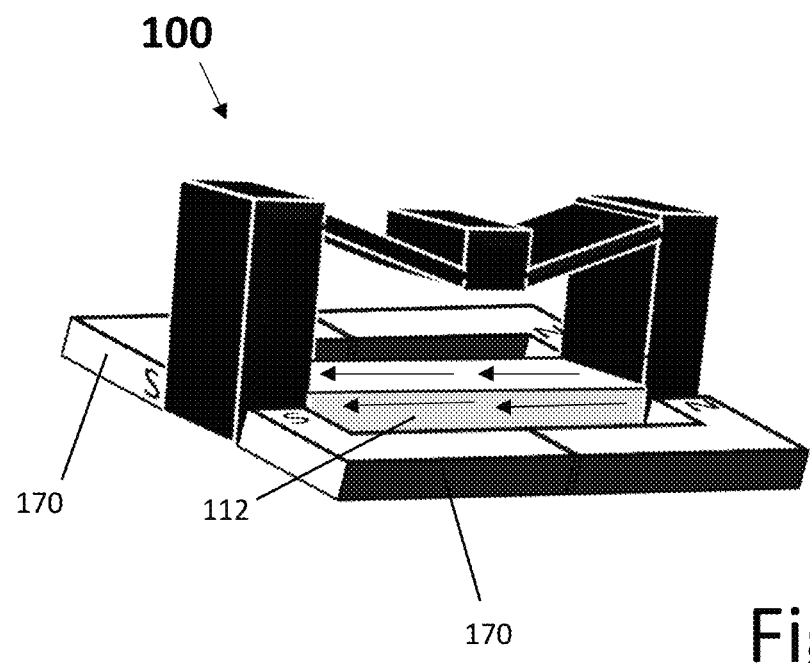

In the example of FIG. 32, the magnet 170 has a non-linear shape (e.g. horseshoe shape). The North pole of the magnet 170 is joined to the front of the second attachment unit 110, while the South pole of the magnet 170 is joined to the front of the first attachment unit 108. In the example of FIG. 32, in addition to the magnet attached to the front of the frame, a second magnet having a non-linear shape is joined to the back of the frame, and having a North pole is joined to the back of the second attachment unit 110 and a South pole joined to the back of the first attachment unit 108. The addition of the second magnets increases the strength of magnetic field though the piezo element 112.

In some embodiments of the present invention, the material of the frame of device 100 is selected with an electronegativity value close to the piezo element 112 and to any contiguous components (such as fasteners or bonding agents, if present) as a means of mitigating galvanic corrosion between two dissimilar metals. In some embodiments of the present invention, a sacrificial or electrically inert material is added to the interface between the frame and the piezo element 112 or between the frame and or any fasteners or bonding agents contacting the frame, to provide passivation to the piezo element 112 or to any fasteners or bonding agents contacting the frame.

In some embodiments of the present invention, the piezo element 112 is chosen to produce electromagnetic energy from a change in internal strain thereof at a substantially high transduction efficiency. Such material is typically determined by the transduction constant or the transduction coupling factor to characterize the electromechanical effect of the material.

FIGS. 3, 4a and 4b illustrate a concave device 201 for generating electrical current in response of pressure applied on one or two pressure receiver units, according to some embodiments of the present invention. In FIG. 2 the device 201 at rest, while in FIGS. 4a and 4b the device 201 deforms under a first external force 200 and/or a second external force 214.

The device 201 includes a compliant, monolithic frame and a piezo element 112. The device 201 has all the features of the device 100 of FIGS. 1-2b, as described above. The device 201 includes a first pressure receiver unit 102, two arms 104 and 106, and two attachment units 108 and 110, disposed and configured to operate as described above. In addition, the device 201 includes a second pressure receiver unit 122, a third arm 124, and a fourth arm 126. The third arm 124 has an end joined to a first lateral side of the second pressure receiver unit 122 and an opposite end joined to the first attachment unit 108. The fourth arm 126 has an end joined to a second lateral side of the second pressure receiver unit 122 and an opposite end joined to the second attachment unit 110.

A first external force 200 directed toward the piezo element 102 may be received by the first pressure receiver unit 102 to deform the frame and compress the piezo element 112 via forces 206 and 212. A second external force 214 directed toward the piezo element 102 may be received by the second pressure receiver unit 122. Under the second external force 214, the second pressure receiver unit 122 is moved toward the piezo element 112 and causes the arms 124 and 126 to rotate (FIG. 4) and/or bend (FIG. 4b), pulling the attachment units 108 and 110 toward each other, thus causing the attachment units to apply the forces 206 and 212 to the piezo element 112, thereby compressing the piezo element, in the same manner described above.

In some embodiments of the present invention, the piezo element 112 extends along a first axis extending between the attachment units when joined to the frame of the device 201. When the frame of the device 201 is at rest, the second pressure receiver unit 122 is positioned symmetrically opposite the first pressure receiver unit 102 with respect to the first axis, the third arm 124 is positioned symmetrically opposite the first arm 104 with respect to the first axis, and the fourth arm 126 is positioned symmetrically opposite the second arm 106 with respect to the first axis.

It should be noted that it is clear that in case the external forces 200 and 214 are in the opposite directions to the directions shown in FIGS. 3, 4a, 4b and are directed away from the piezo element, the deformation of the frame would cause the forces 206 and 212 would be in directions opposite to the directions seen in the drawings, causing extension of the piezo element from the rest configuration of the piezo element, thereby causing a change in strain to the piezo element. It is possible that external forces 200 and 214 are vibrating forces that change directions at different times. In this case, if the piezo element is not pre-strained, the deformation of the device 100 varies and causes tensile strain and compression strain to the piezo element at different times. As explained above, in some embodiments, the piezo element 112 is under pre-strain when the frame is at rest, without any external forcing of receiver units 102 and 122. Thus, the level of pre-strain of the piezo element and the structural features of the frame may be configured such that aforementioned vibrating external forces 200 and 214 (which cause the reversal of directions of the forces 206 and 212) would only cause a change in the magnitude of the compression strain of the piezo element, without changing the direction of the strain between compression strain and tensile strain.

The device 201 may include one or more permanent magnets, to enhance the magnetic transduction of the piezo element, as explained above with reference to FIGS. 26-33.

FIGS. 5 and 6 illustrate a convex device 300 for generating electrical current applied on one pressure receiver unit, according to some embodiments of the present invention. In FIG. 5, the device 300 is at rest. In FIG. 6, the device 300 is deformed under a pressure 200.

The device 300 includes a compliant, monolithic frame and a piezo unit 112. The device 300 is similar to the device 100 of FIGS. 1-2b described above and has the same features described above for the device 100. The difference between the device 300 and the device 100 lies in the fact that the frame of the device 300 is convex at rest. In fact, when the device 300 is at rest, the distance between the first pressure receiver element 102 and the piezo element 112 is larger than the distance between the second end of the first arm 104 and the piezo element 112 and larger than the distance between the second end of the second arm 106 and the piezo element 112.

As seen in FIG. 6, when an external force 200 is applied to the first pressure receiver unit 102 and is directed from the first pressure receiver unit toward the piezo element 112, the first pressure receiver unit is pushed toward the piezo element 112. This causes the first arm 104 and the second arm 106 to rotate in opposite directions. The first arm 104 rotates clockwise with respect to the first pressure receiver unit 102 (as shown by the curved arrow 204) and with respect to the first attachment unit 108 (as shown by the curved arrow 202), while the second arm 106 rotates counterclockwise with respect to the first pressure receiver unit 102 (as shown by the curved arrow 210) and with respect to the second attachment unit 110 (as shown by the curved arrow 208).

The rotation of the arms 104 and 106 causes the arms 104 and 106 to apply first forces to the attachment units 108 and 110, pushing the attachment unit 108 and 110 away from each other. Thus, the first attachment unit 108 applies a force 246 to the piezo element 112 in a first direction, while the second attachment unit 110 applies a force 242 to the piezo element 112 in a second direction, thereby applying forces that extend the piezo element from a rest configuration thereof and changing the strain of piezo element. The strain change of the piezo element 112 causes the piezo element 112 to respond by creating a voltage therethrough and/or changing a magnetic field/flux thereof, as explain above, allowing the flow of electrical current in a circuit associated with the piezo element 112.

While it is possible that the first arm 104 and second arm 106 may bend slightly, in some embodiments of the present invention, the thickness of the arms is set so that the bending of the arms is decreased or eliminated, in order to more efficiently transfer the external force from the first pressure receiver unit 102 to the attachment units 108 and 110.

It should be noted that it is clear that in case the external force 200 is in the opposite direction from the direction drawn in the figures and points away from the piezo element, the deformation of the frame would cause the forces 206 and 212 would be in directions opposite to the directions seen in the drawings, applying compression forces to the piezo element and changing the strain of the piezo element. It is possible that external force 200 is a vibrating force which changes directions at different times, If the piezo element is not pre-strained when the device 100 is at rest, the deformation of the device 100 cause by the vibrating external force 200 varies and would cause both the extension and compression strain to the piezo element at different times. As explained above, in some embodiments, piezo element 112 is under pre-strain without any external forcing of receiver units 102 and 122. Thus, the level of pre-strain of the piezo element and the structural features of the frame may be set such that the aforementioned vibrating pressure 200 only cause a change in the magnitude of the strain on the piezo element 112, without changing the direction of the strain on the piezo element 112.

The device 300 may include one or more permanent magnets, to enhance the magnetic transduction of the piezo element, as explained above with reference to FIGS. 26-33.

Figure 7:
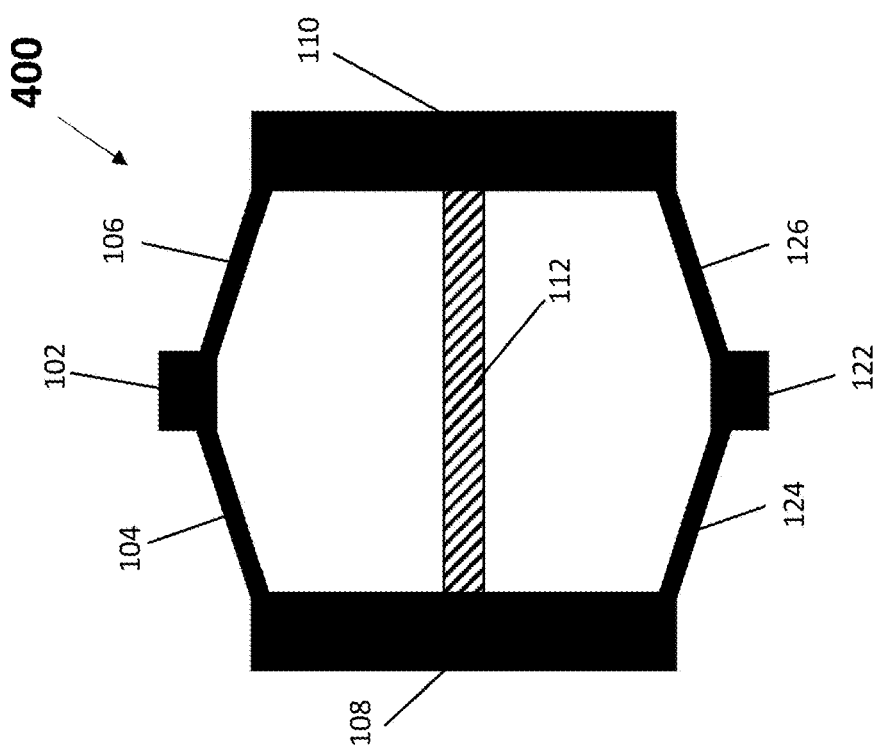
Figure 9:
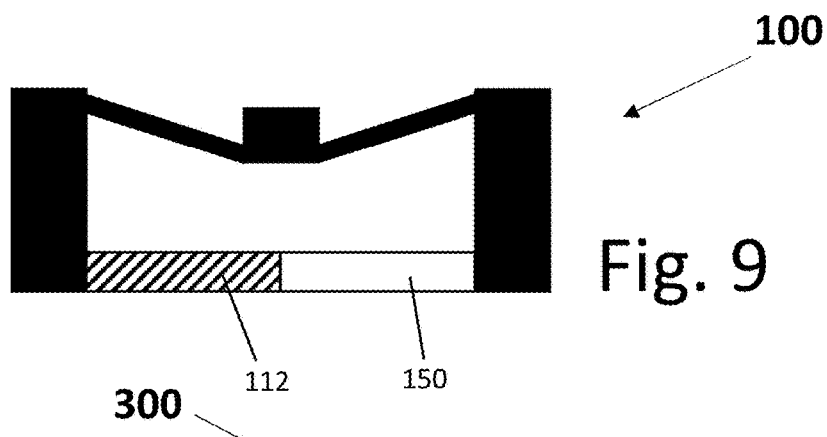
FIGS. 9-12 illustrate devices for generating electrical current, which includes a spacer configured for at least partially compensating for the difference between a first temperature dependent size change of the frame and a second temperature dependent size change of the current generating element, according to some embodiments of the present invention.
Figure 10:
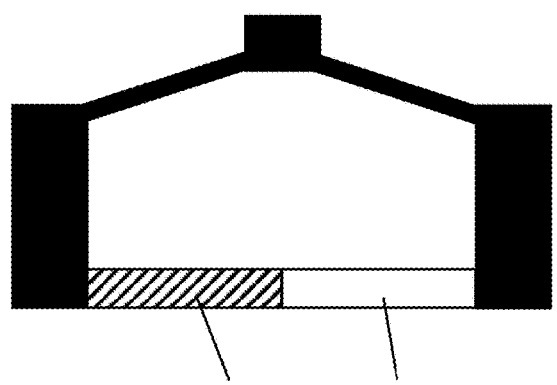
Figure 11:
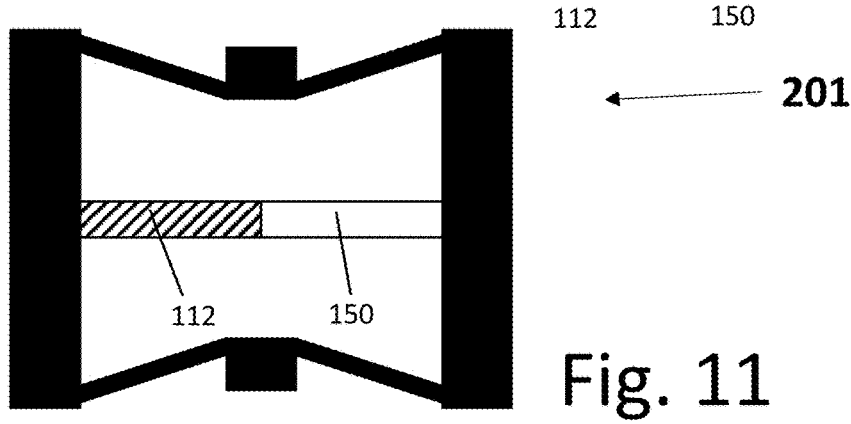
Figure 12:
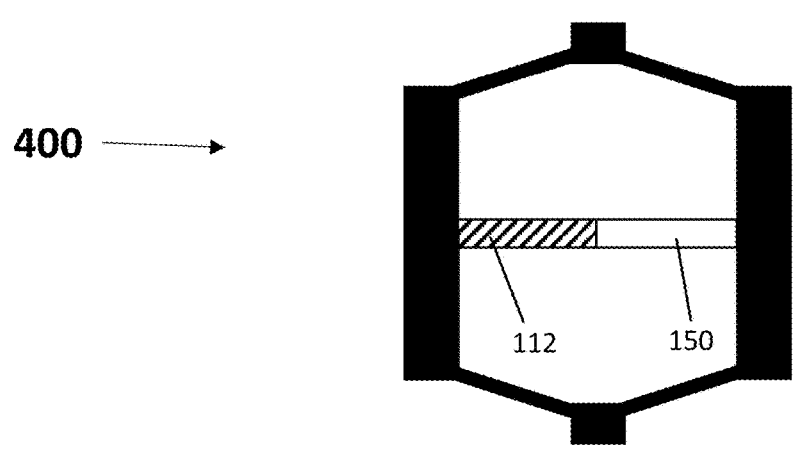

FIGS. 7 and 8 illustrate a convex device 400 for generating electrical current in response to one or external more external forces applied on one or two pressure receiver units, according to some embodiments of the present invention. In FIG. 7, the device 400 is at rest. In FIG. 8, the device 400 is deformed under pressure.

The device 400 is similar to the device 300 of FIGS. 6-7, and sports all the features of the device 300. The device 400 includes a first pressure receiver unit 102, two arms 104 and 106, and two attachment units 108 and 110, disposed and configured to operate as described above. In addition, the device 400 includes a second pressure receiver unit 122, a third arm 124, and a fourth arm 126. The third arm 124 has an end joined to a first lateral side of the second pressure receiver unit 122 and an opposite end joined to the first attachment unit 108. The fourth arm 126 has an end joined to a second lateral side of the second pressure receiver unit 122 and an opposite end joined to the second attachment unit 110.

A first external force 200 may be received by the first pressure receiver unit 102 to deform the frame and change the strain of the piezo element 112 via forces 242 and 246. A second external force 214 may be received by the second pressure receiver unit 122. Under the second external force, 214, the second pressure receiver unit 122 is moved toward the piezo element 112 and causes the arms 124 and 126 to rotate, pushing the attachment units 108 and 110 away from each other, thus causing the attachment units to apply the forces 242 and 246 to the piezo element 112, thereby applying tensile forces to and changing the strain of the piezo element, in the same manner described above.

In some embodiments of the present invention, the piezo element extends along a first axis extending between the attachment units when joined to the frame of the device 201. When the frame of the device 201 is at rest, the second pressure receiver unit 122 is positioned symmetrically opposite the first pressure receiver unit 102 with respect to the first axis, the third arm 124 is positioned symmetrically opposite the first arm 104 with respect to the first axis, and the fourth arm 126 is positioned symmetrically opposite the second arm 106 with respect to the first axis.

It should be noted that it is clear that in case the external forces 200 and 214 are in direction opposite to the directions drawn in the figures and point away from the piezo element, the deformation of the frame would cause the forces 242 and 246 would be in directions opposite to the directions seen in the drawings, compressing the piezo element and changing the strain of the piezo element. It is possible that external forces 200 and 214 are vibrating forces, so the deformation of the device 100 varies and would cause the forces 206 and 212 to change directions at different times, thereby at times pushing toward the piezo element and at times pulling away from the piezo element. If the piezo element is not pre-strained, this would cause a change of strain on the piezo element 112 between tensile and compression strain. In some embodiments, the piezo element 112 is under pre-strain when the device 100 is at rest, without any external forcing of receiver units 102 and 122. Thus, the level of pre-strain of the piezo element and the structural features of the frame may be set such that the aforementioned vibrating external forces 200 and 214 would only cause a change in the magnitude of the strain on the piezo element 112 without a change in direction in the strain between tensile strain and compression strain.

The device 400 may include one or more permanent magnets, to enhance the magnetic transduction of the piezo element, as explained above with reference to FIGS. 26-33.

FIGS. 9-12 illustrate devices 100, 201, 300, and 400 described above, each including a spacer 150 configured for at least partially compensating for the difference between a first temperature dependent size change of the frame and a second temperature dependent size change of the current generating element, according to some embodiments of the present invention.

Generally, different materials have different coefficients of thermal expansion. Therefore, it is possible that the frame has a first coefficient of thermal expansion and the piezo element has a second coefficient of thermal expansion. The spacer 150 is located between one of the attachment units and the piezo element 112. The spacer 150 has a third coefficient of thermal expansion. In this manner, a difference between a first temperature dependent size change of the frame and a second temperature dependent size change of the piezo element is at least partially compensated by a third temperature dependent size change of the spacer, within a predetermined range of temperatures.

The compensation by the spacer 150 increases the consistency of the devices 100, 201, 300, 400, by maintaining strain uniformity in the device. In various aspects, the material types, geometric shape, and dimensional sizing is selected such that frames, piezo elements 112, and spacers 150 provide the means of improving the strain uniformity.

In some embodiments of the present invention, the spacer 150 is made of a material with sufficiently small elastic modulus to provide mechanical compliance to off-axis strain. A compliant spacer 150 provides a means of self-correcting any misalignment to the strain direction of piezo element 112 during transduction.

In a variant, the contiguous interface between the frame and the spacer 150 provides a point, a line contact, or in another manner that allows one or more degrees of freedom such as pivot and rotation of the spacer 150 with respect to the frame. One or more advantages of having said degrees of freedom is for providing the capability of self-correcting any misalignment and the capability of improving strain uniformity to piezo element 112 for greater transduction reliability.

In one or more aspects, the consistency of the devices 100, 201, 300, 400 is affected by temperature variations when the devices are exposed to hot and cold environments. In various aspects, the frame, piezo element 112, and spacer 150 expand or contract in different amounts in response to temperature change. The differences may cause internal strain that is non-uniform in both direction and magnitude. In various aspects, the material and geometry of the spacer compensates for the differences in thermal expansion or contraction as a means of matching the combined temperature effects to the frame and the piezo element. In one or more aspects, the sum of the linear deformation of the spacer 150 and the piezo element 112 matches that of frame over a temperature range of −100 and +100 degrees Celsius. The spacer 150 may include brass, aluminum, or another material to substantially match the thermal expansivity tolerances given the environmental variabilities. In various aspects, the material for spacer 150 has a thermal expansivity of 5 to 15 parts per million or $1/1,000,000$.

Figure 13:
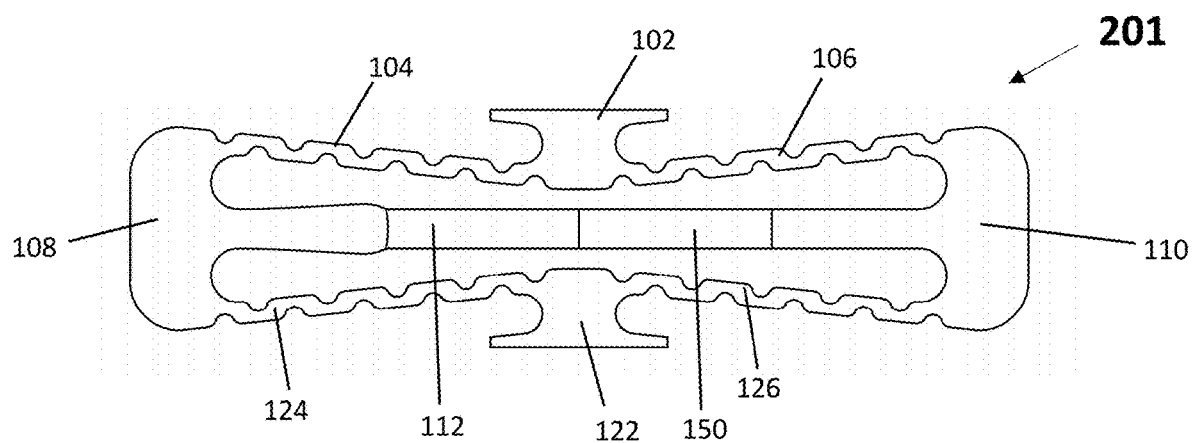
FIGS. 13 and 14 illustrate an example a concave device with corrugated arms according to some embodiments of the present invention.
Figure 14:
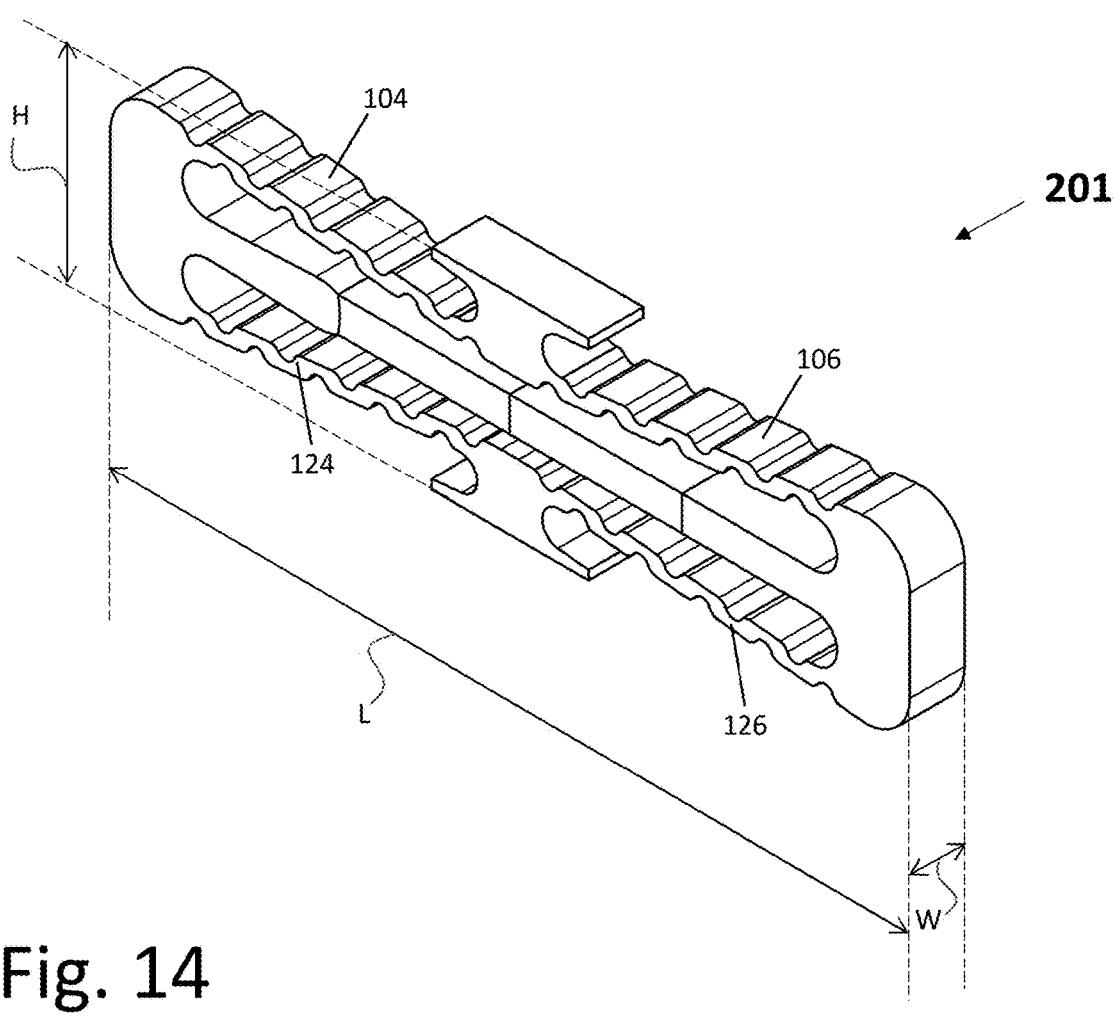

FIGS. 13 and 14 illustrate an example a concave device 201 with corrugated arms according to some embodiments of the present invention. FIG. 13 is a front view of the device 201. FIG. 14 is a perspective view of the device 201.

In some embodiments of the present invention, the arms of the 104, 106, 124, and 126 of the device 201 are corrugated. The corrugation of the arms may reduce the maximal local strain of the arms when pressure is applied to the pressure receiving elements 102 and 122. Specifically, the corrugation reduces the bending stiffness without weakening the tensile strength of arms 204. The corrugation of the arms may comprise other cross-sectional geometries, such square-wave profiles.

It should be noted that any of the devices 100, 201, 300, 400 may have corrugated arms, and that the corrugation of the arms is applicable to aforementioned concave and convex devices to benefit from the aforementioned favorable aspects of the corrugation architecture.

Figure 15:
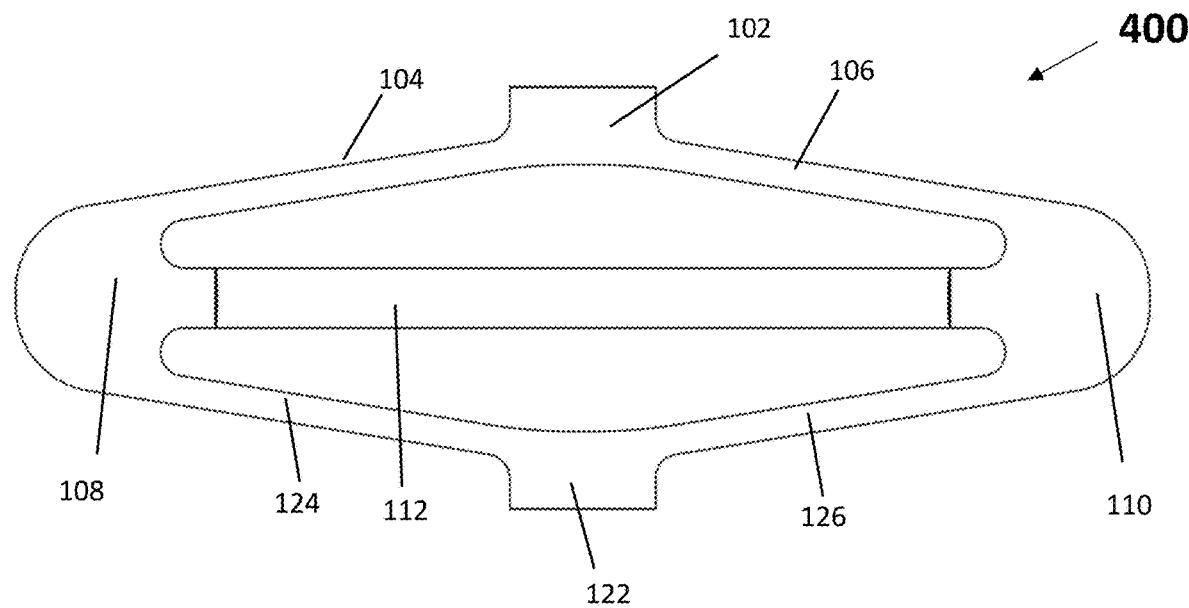
FIGS. 15 and 16 illustrate a design of a prototype of a convex device, according to some embodiments of the present invention.
Figure 16:
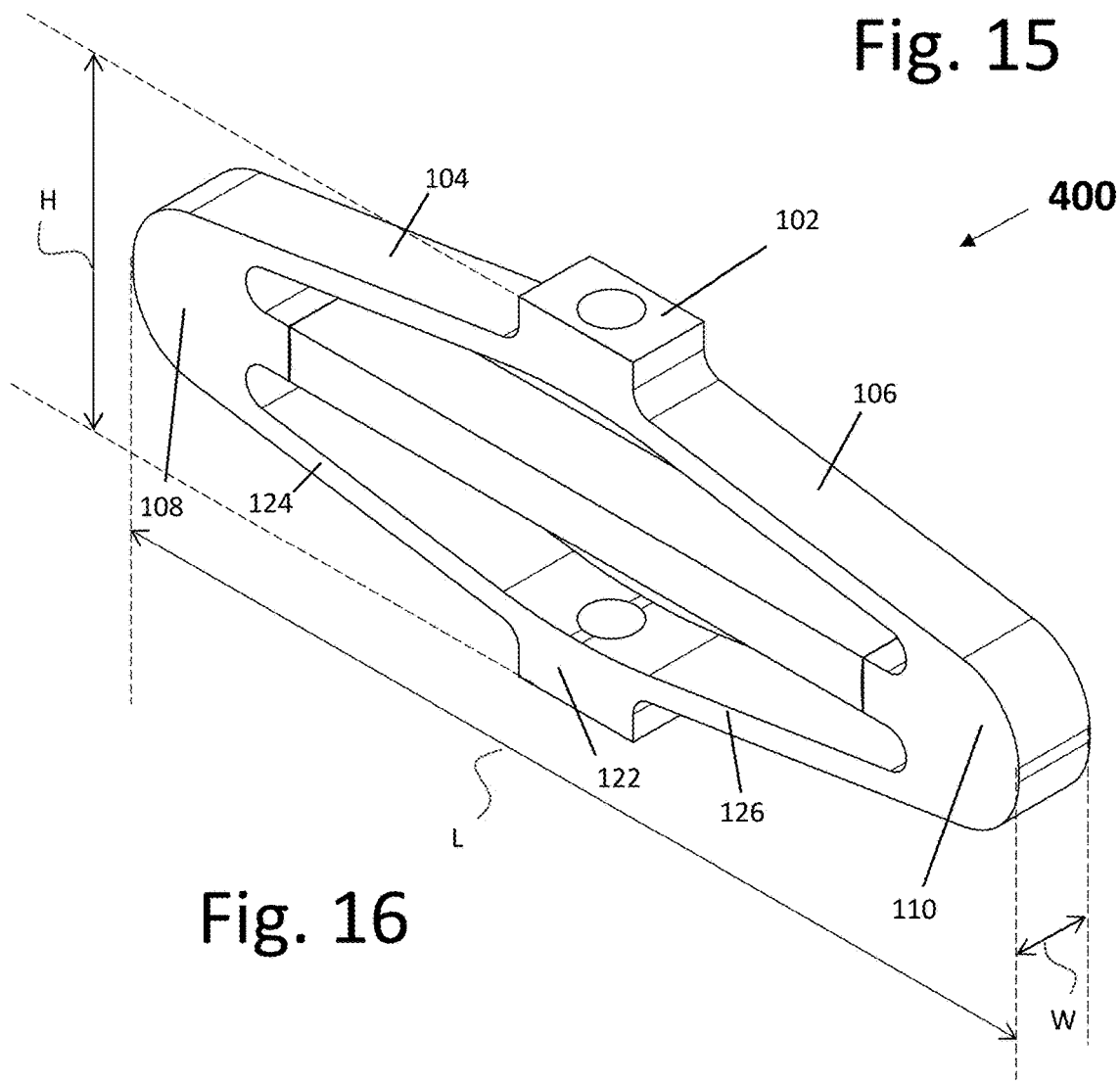

FIGS. 15 and 16 illustrate a design of a prototype of a convex device 400, according to some embodiments of the present invention. FIG. 15 is a front view of the device 400. FIG. 16 is a perspective view of the device 400. As noted above, the arms 104, 106, 124, 126 are thinner than the first and second pressure receiving elements 102 and 122 and thinner than the attachment units 108 and 110. In various embodiments, arms 104, 106, 124, 126 have a minimum and a maximum angle of 5 and 15 degrees with respect to the lengthwise axis of piezo element 112, when the device is at rest. The respective advantages pertain to the adjustability of the compliance of devices 100, 201, 300, 400 for a given device dimension. Furthermore, in some embodiments of the present invention, a compressive pre-strain is applied to the piezo element 112 by the device structure during fabrication.

As a result, even at rest, devices 100, 201, 300, 400 would be under internal stress that is in tension for the structure, or more specifically, the arms 104, 106, 124, 126, and compression for the piezo element 112. This is advantageous for piezo materials that have a higher compressive strain limit than tensile strain limit, beyond which the piezo material becomes permanently damaged. In some materials, without limitation, the compressive strain limit is 0.3 percent of the length of the piezo material, while the tensile strain limit is 0.01 percent of the length of the piezo material. Thus, having the piezo element with an initial compressive strain would cause pressures on the frame to compress and extend the piezo element without changing the strain of the piezo material from compressive to tensile. In fact, when the piezo material is extended by the pressures applied to the frame, the compression strain would decrease but not change to a tensile strain. In a non-limiting example, of the present invention, the pre-strain is a compression strain set at 0.15 percent of the length of the non-strained piezo element, while the material and structural properties of the device 100 cause an external force having a known or predetermined maximal magnitude to cause the strain to change by 0.1 percent of the non-strained length of the piezo element by compression or extension, depending on the direction of the external force. Thus, when the external force causes the compression of the piezo element by 0.1 percent, the total strain of the piezo element is a compression strain of 0.25 percent, which is short of the 0.3 percent compressive strain limit. The external force causes the extension of the piezo element by 0.1 percent, the total strain of the piezo element is still a compression element of 0.05 percent, which is between the compressive strain limit of 0.3 percent and the tensile strain limit of 0.01 percent. In this manner, the pre-strain of the piezo element does not reach its compression or tensile strain limit and therefore helps prevent permanent damage to the piezo element.

Figure 17:
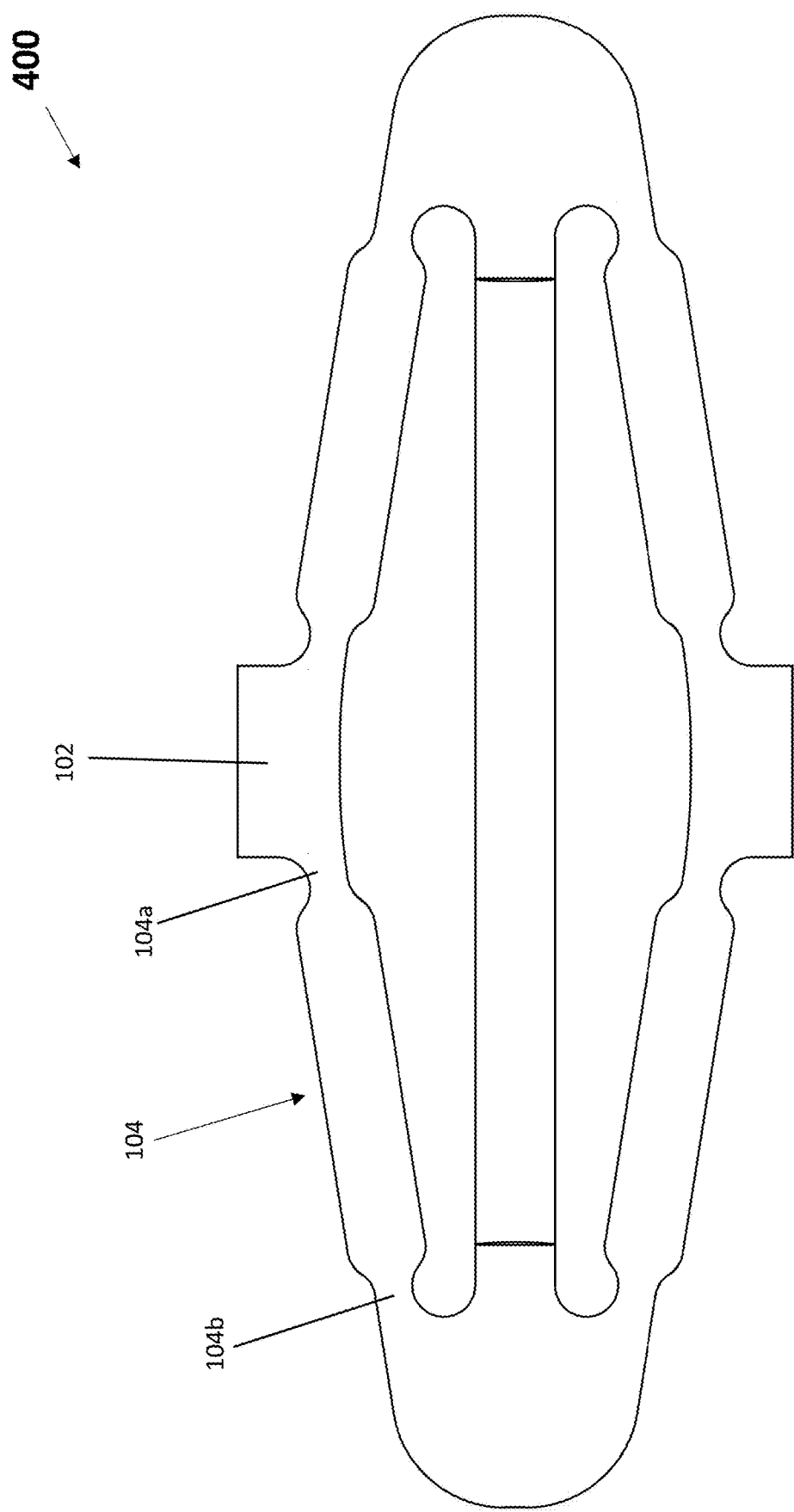
FIG. 17 is a front view of a convex device for generating electrical current, in which the ends of the arms are thinner than central portions of the arms, according to some embodiments of the present invention.

FIG. 17 is a front view of a convex device 400 for generating electrical current, in which the ends of the arms are thinner than central portions of the arms, according to some embodiments of the present invention.

In the example of FIG. 17, the arm 104 has a first end 104a and a second end 104b. The first end 104a is joined to the first pressure receiving element 102, while the second end 104b is joined to the first attachment unit 108. The first end 104a and the second end 104b are thinner than then the central portion of the first arm 104. This feature eases the rotation of the arm 104 with respect to the first pressure receiving element 102 and with respect to the first attachment unit 108, when the first pressure receiving element 102 is moved to an external pressure. The other arms share the same geometry as the first arm 104.

It should be noted that though the example of FIG. 17 is shown with regard to the convex device 400 with two pressure receiving elements, the features of the arms described in FIG. 17 may be applied to any one of the devices 100, 200, and 300, described above.

Figure 18:
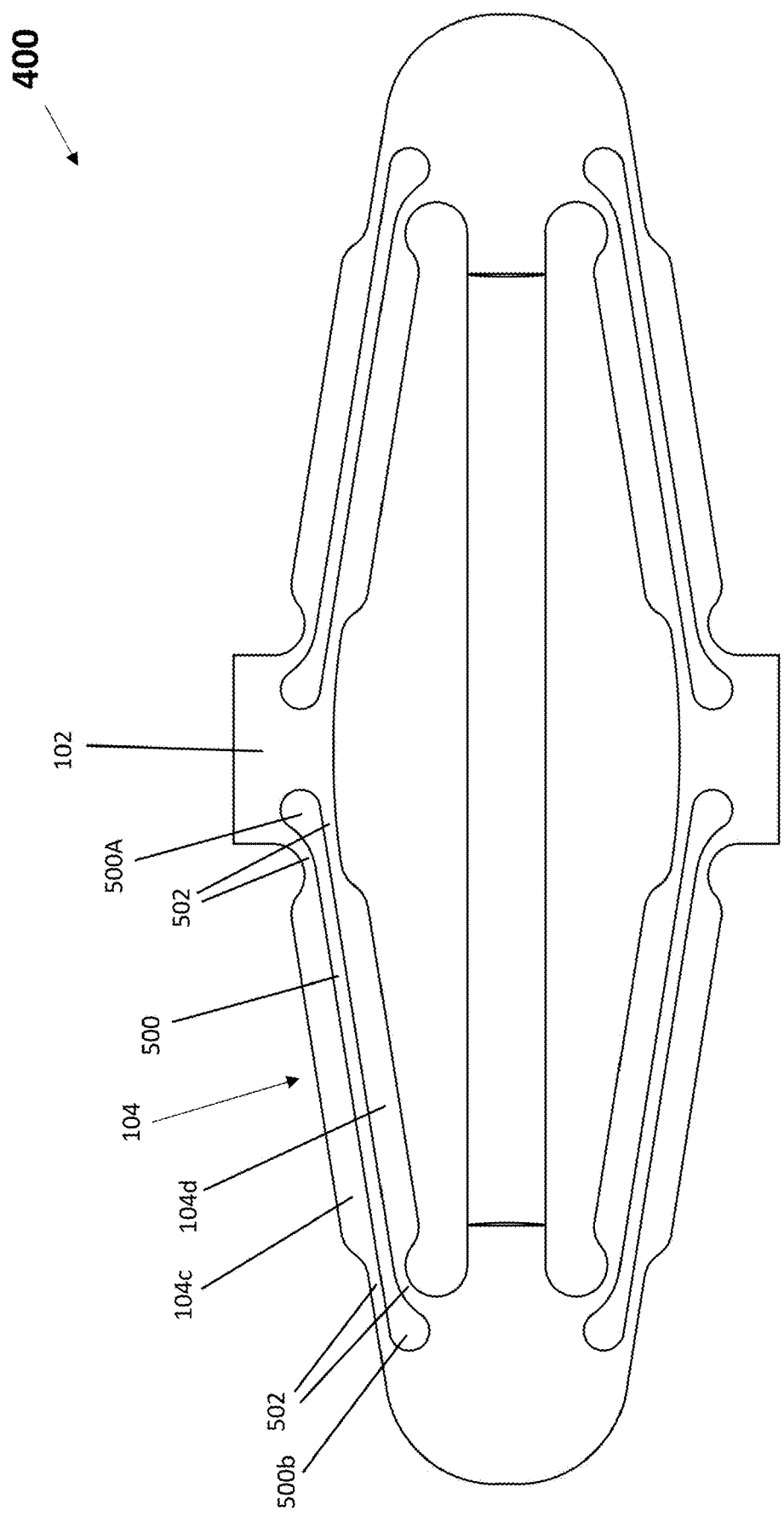
FIG. 18 illustrates an example a convex device with grooved arms, according to some embodiments of the present invention.

FIG. 18 illustrates an example a convex device 400 with grooved arms, according to some embodiments of the present invention.

In the example of FIG. 18, the first arm 104 has a groove or slot 500 traversing the arms and extending between the first end of the arm and the second end of the arm. In some embodiments of the present invention, the groove or slot 500 has an end portion 500a extending into the first pressure receiving element 102 and an end portion 500b extending into the first attachment unit 108. In some embodiments of the present invention, the groove or slot 500 extends parallel the central axis along which the first arm 104 extends. In some embodiments of the present invention, the groove or slot 500 extends along the central axis along which the first arm 104 extends, thereby dividing the first arm into an upper section 104c and a lower section 104d parallel to each other. In some embodiments of the present invention the size of the groove or slot 500 is chosen to prevent physical contact between the upper section 104c and lower section 104d, even during bending and rotation of the arms 104.

In some embodiments of the present invention, the ends of the arm 104 are thinner than the central portion of the arm (as explained above in the description of FIG. 17). The groove or slot 500 splits the already thin ends into thinner portions that function as thin rotational hinges 502 at which the global bending stiffness of arm 104 is reduced. In a non-limiting example, each thin hinge 502 has a thickness that is about one-tenth of the thickness of arm 104 at the center of the arm.

The hinges 502 provide a means of stress relief for the arm 104. For a given degree of bending or rotation, the strain that occurs at the hinges 502 produces smaller local stress of the material as compared to arms without hinges. The hinges 502 mitigate the stress concentrations that would otherwise cause fatigue damage. The grooved arms with thin hinges enable a greater range of motion without material fatigue in a manner that increases transduction reliability.

It should be noted that the geometry of the arm described in the example of FIG. 18 is not limited to the convex device 400 with two pressure receiving elements, but may be applied to the arms of any one the devices 100, 200, and 300 described above.

While the devices 100, 201, 300, 400 may be produced in different sizes, some examples of the geometrical dimensions and compliance of device 201 and 400 are provided as follows, with reference to FIGS. 14 and 16. In one embodiment, a steel structure having external dimensions of 25 mm×10 mm×3 mm (L×H×W) combined with an 18 mm×3 mm×3 mm (L×H×W) piezo element 112 has a compliance of 0.01 millimeters per Newton. In another embodiment, a titanium structure having external dimensions of 25 mm×10 mm×3 mm (L×H×W) combined with a with a 25 mm×5 mm×3 mm (L×H×W) piezo element 112 has a compliance of 0.001 millimeter per Newton. The height H is the height of the devices at rest.

Figure 19:
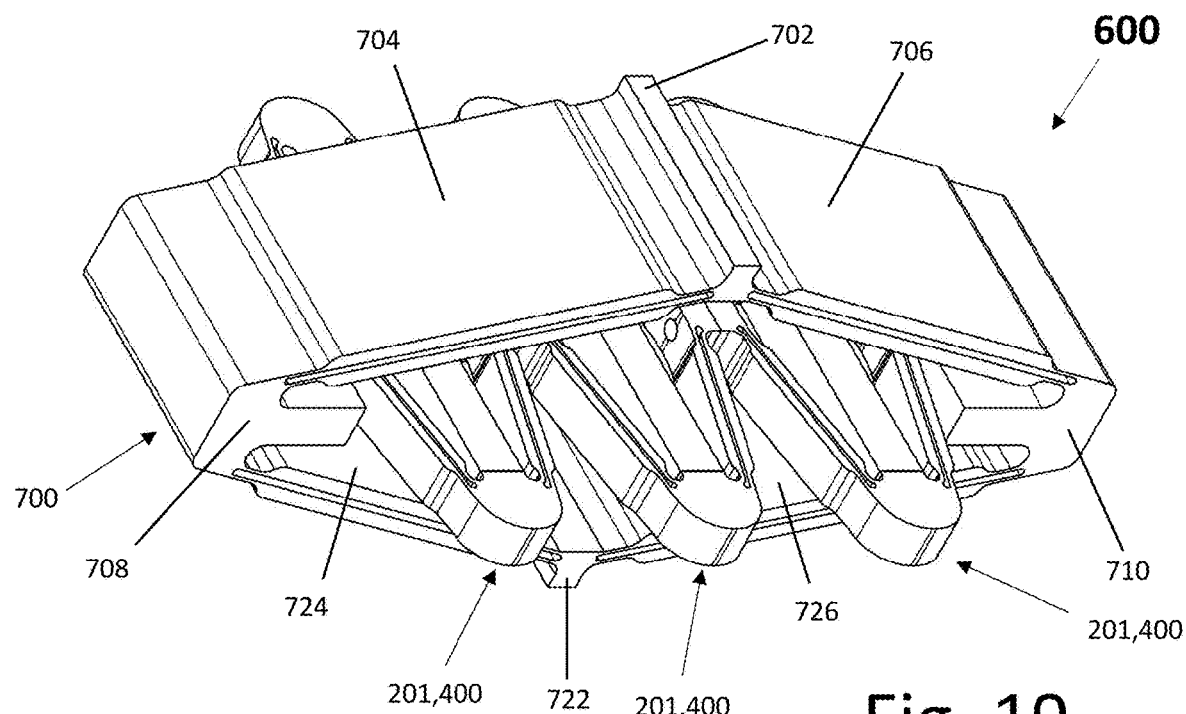
FIGS. 19 and 20 illustrate a device for generating electrical current, including an outer frame and a plurality of inner current generating devices, according to some embodiments of the present invention.
Figure 20:
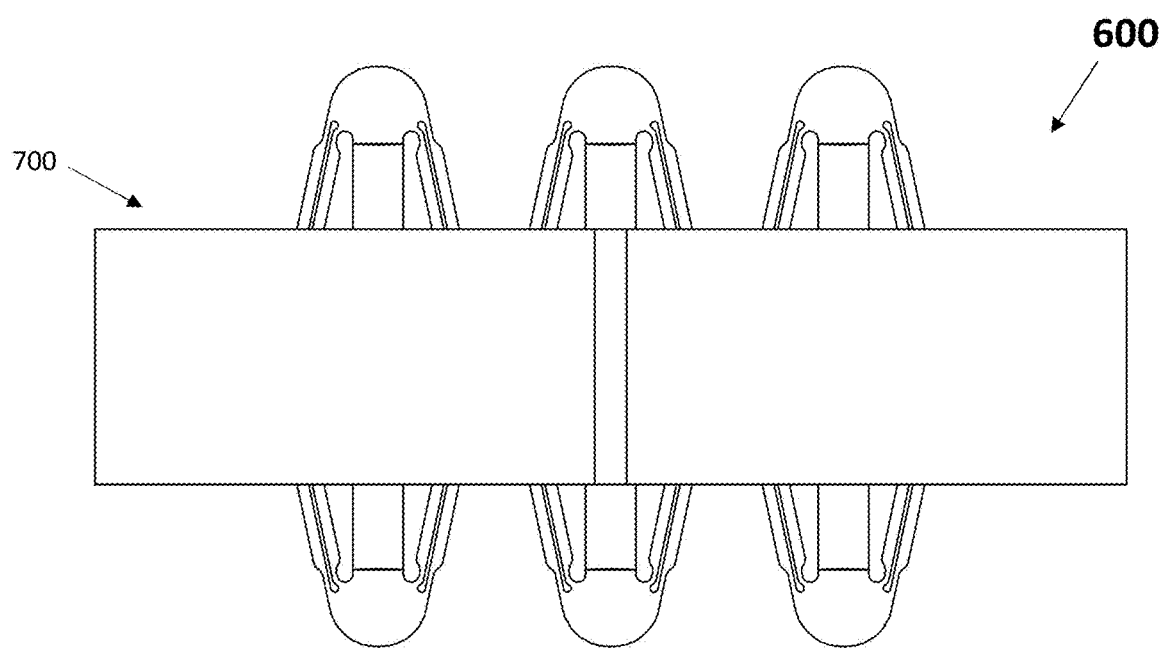

FIGS. 19 and 20 illustrate a device 600 in a nested configuration for generating electrical current, including an outer frame 700 and a plurality of inner current generating devices (201, 400), according to some embodiments of the present invention. FIG. 19 is a perspective view of the device 600. FIG. 20 is a top view of the device 600.

The outer frame 700 is configured like the concave frame of the device 201 of FIGS. 3, 4a, 4b, 11, 13, 14 or like the convex frame of the device 400 of FIGS. 7, 8, 12, 15, 16. 17, 18. The outer frame 700 has pressure receiver units 702 and 722, upper arms 704 and 706, lower arms 724 and 726, and attachment units 708 and 710, and are configured like the respective elements of the frame of the devices 201 and 400 described above.

The attachment units 708 and 710 are not joined directly to piezo elements as described above. Rather, a plurality of current generating devices 201, 400 are disposed in sequence between the attachment units 708 and 710. The second pressure receiver unit 122 of one of the inner frames contacts the first pressure receiver unit 102 of a subsequent inner frame. Moreover, the inner devices are placed inside the outer frame, so that the first pressure receiver unit 102 of a first inner device (201, 400) of the sequence is attached to the attachment unit 708 of the outer frame 700, and the second pressure receiver unit 112 of a last inner device (201, 400) of the sequence is attached the attachment unit 710 of the outer frame 700.

In this manner, an external force applied on at least one of the pressure receiver units 702 and 722 of the outer frame 700 causes the outer frame to deform, as explained above. Depending on the direction of the external force, an external force applied to the upper pressure receiver unit 702 causes the pressure receiver unit 702 to move toward or away from the sequence of inner frames, thereby causing the upper arms 704 and 706 to rotate in opposite directions with respect to the pressure receiver unit 702 and in opposite directions with respect to the attachment units 708 and 710 respectively, thus applying first forces in different directions to the respective attachment units 708 and 710.

An external force applied to the lower pressure receiver unit 722 causes the lower pressure receiver unit 722 to move toward or away from the sequence of inner frames, depending on the direction of the external force. This causes the lower arms 724 and 726 to rotate in opposite directions with respect to the lower pressure receiver unit 722 and in opposite directions with respect to the attachment units 708 and 710, respectively, thus applying second forces in different directions to the respective attachment units 708 and 710.

The first force and second force cause the attachment unit 708 to apply a first secondary force on the first pressure receiver unit 102 of the first inner frame of the sequence. The first force and second force further cause the attachment unit 710 to apply a second secondary force on the second pressure receiver unit 122 of the last inner frame of the sequence.

Thus, at each inner device (201, 400) in the sequence, the first pressure receiver unit 102 and the second receiver units 112 moves toward or away from the respective current generating element (piezo element). This causes the arms of the inner devices to apply tertiary forces in different directions to the respective first and second attachment units, causing the respective first and second attachment units of the inner devices to apply quaternary forces in different directions to the respective edges of the respective current generating elements (piezo elements), thereby changing the strain of the piezo elements.

The device 600 therefore changes strain in a plurality of inner current generating devices and allows production of electricity therefrom. This lowers the strain change on each frame and piezo element, thereby increasing the lifetime of the inner devices (201, 400) in the device 600. Production of electricity is not compromised, as strain is changed in a plurality of piezo elements. Furthermore, the compliance of the device is greatly increased with the nested configuration in various embodiments as described. One implication is that device 600 has a lower resonant frequency than those of the inner devices 201, 400.

Figure 21:
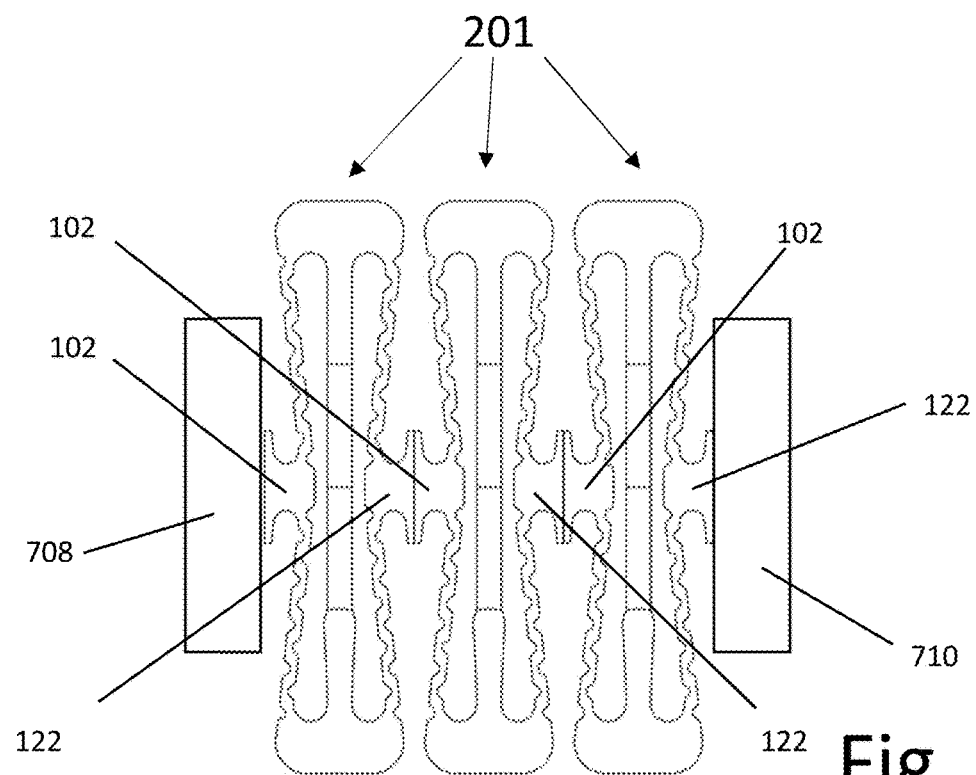
FIGS. 21-25 illustrate non-limiting examples of sequences of inner electricity generating devices within the outer frame of the device of FIGS. 19 and 20.
Figure 22:
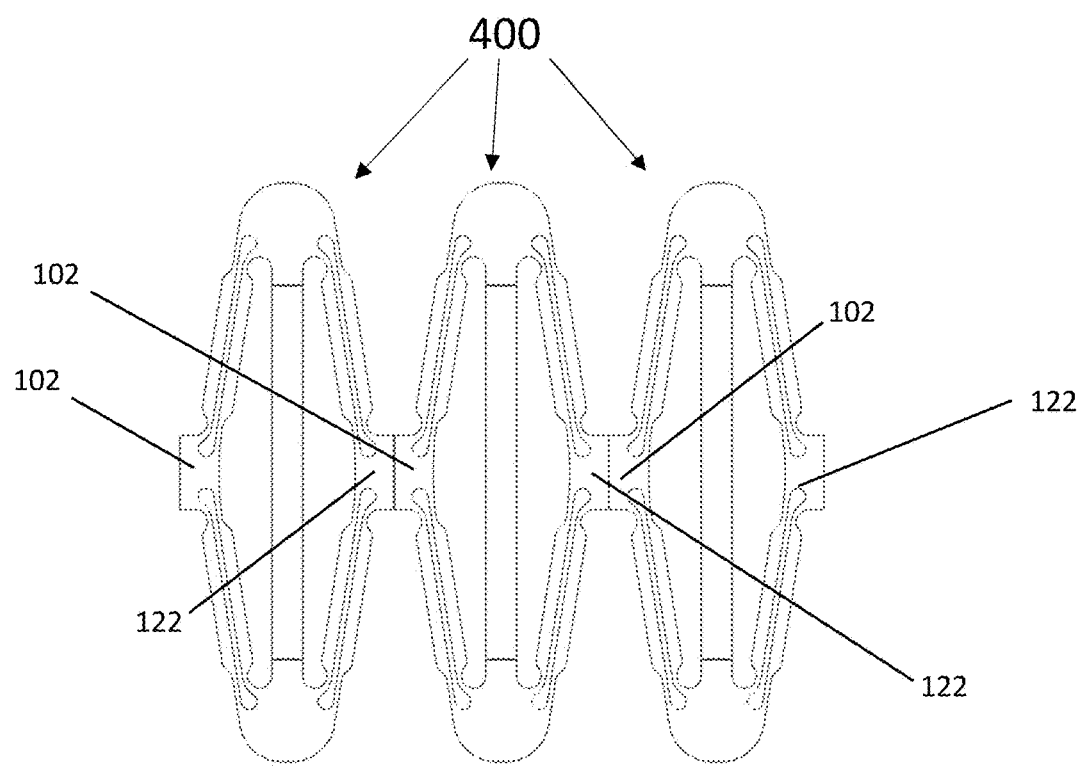
Figure 23:
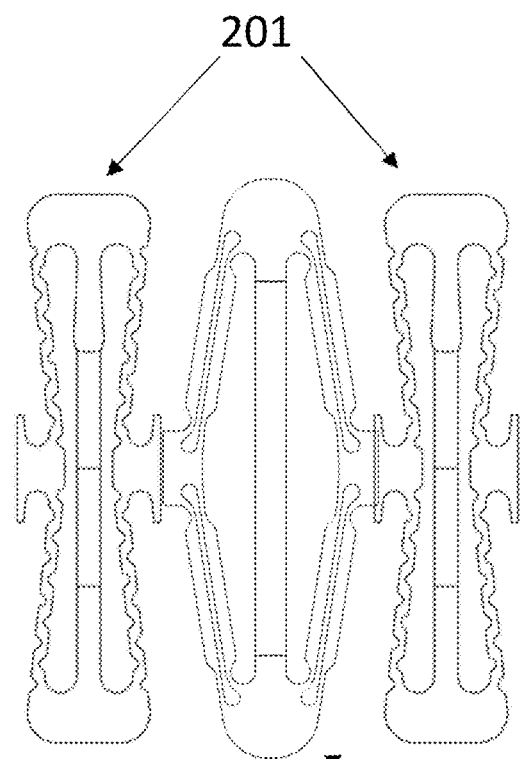
Figure 24:
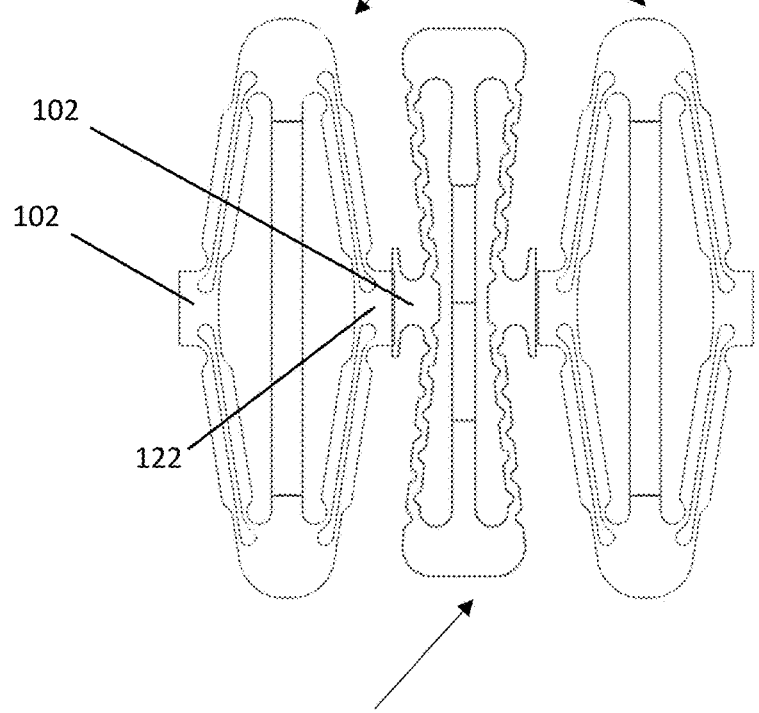
Figure 25:
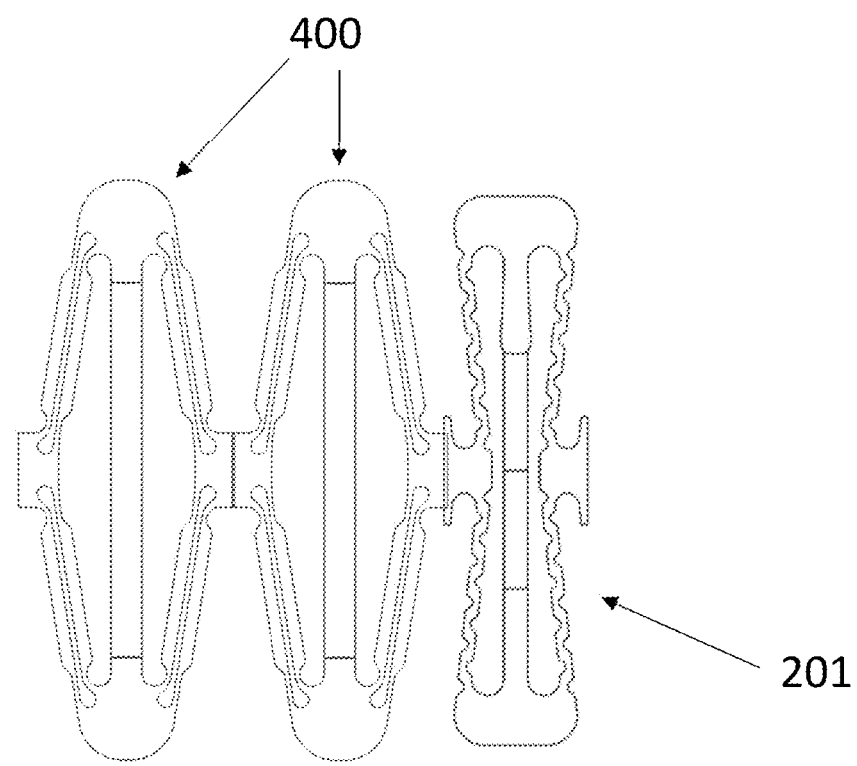

FIGS. 21-25 show examples of different sequences of inner current generating devices in the device 600. In the example of FIG. 21, all of the inner current generating devices are concave devices 201 placed side by side between the attachment units 708 and 710. In the example of FIG. 22, all of the inner current generating devices are convex devices 400 placed side by side. In the examples of FIG. 23-25, some of the inner current devices are concave devices 201 and some are convex devices 400, disposed in different orders.

Figure 34:
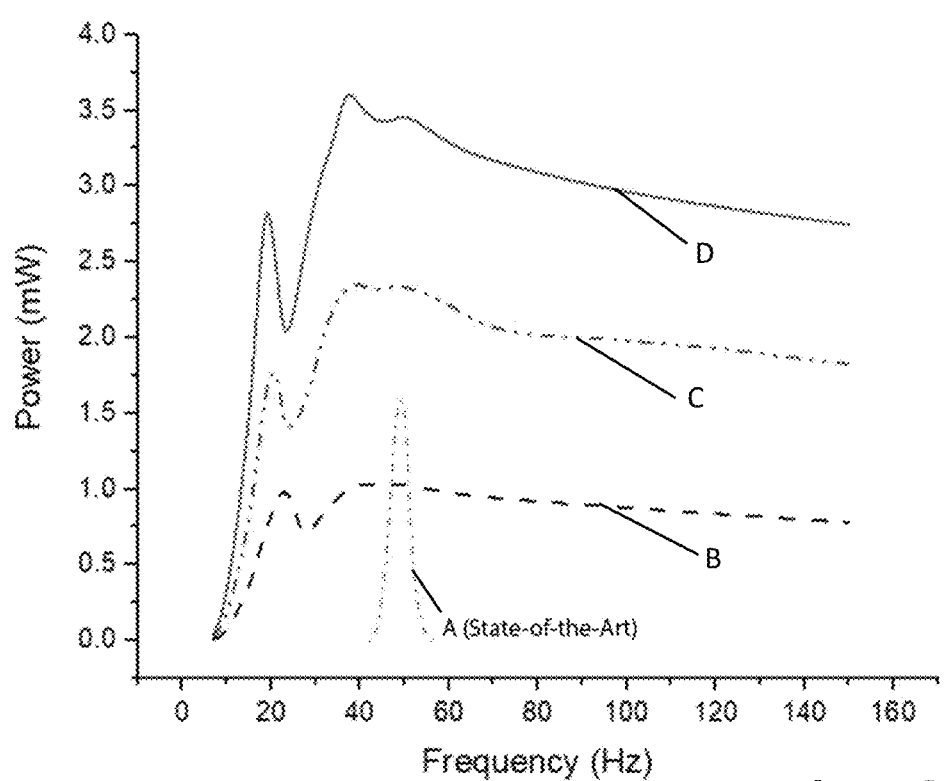
FIG. 34 is a graph illustrating a comparison between power generation as a function of vibration frequency achieved by using a transducing device of the present invention and the power generation of a transducing device known in the general art as a function of the vibration frequency.

FIG. 34 is a graph showing graphs B, C, D, which show the power generation of a device 100, 201, 300, 400 as a function of the vibration frequency. The difference between graphs B, C, D is the amplitude of the vibration (i.e., external force applied to the frame). The external force applied at graph D is larger than the external force applied at graph C, which is larger than the external force applied at graph B. Here the magnitude may be defined as 1 g (acceleration of gravity, or 9.8 m/s$^2$) for B, 2 g for C, and 3 g for D. Or, the said magnitude may be defined as 0.1 mm, 0.2 mm, or 0.3 mm for B, C, and D, respectively. The graph A shows power generation as a function of vibration frequency of a state-of-the-art device, where the external force applied to the device is the same as the external force applied to frame at graph B.

Figure 35:
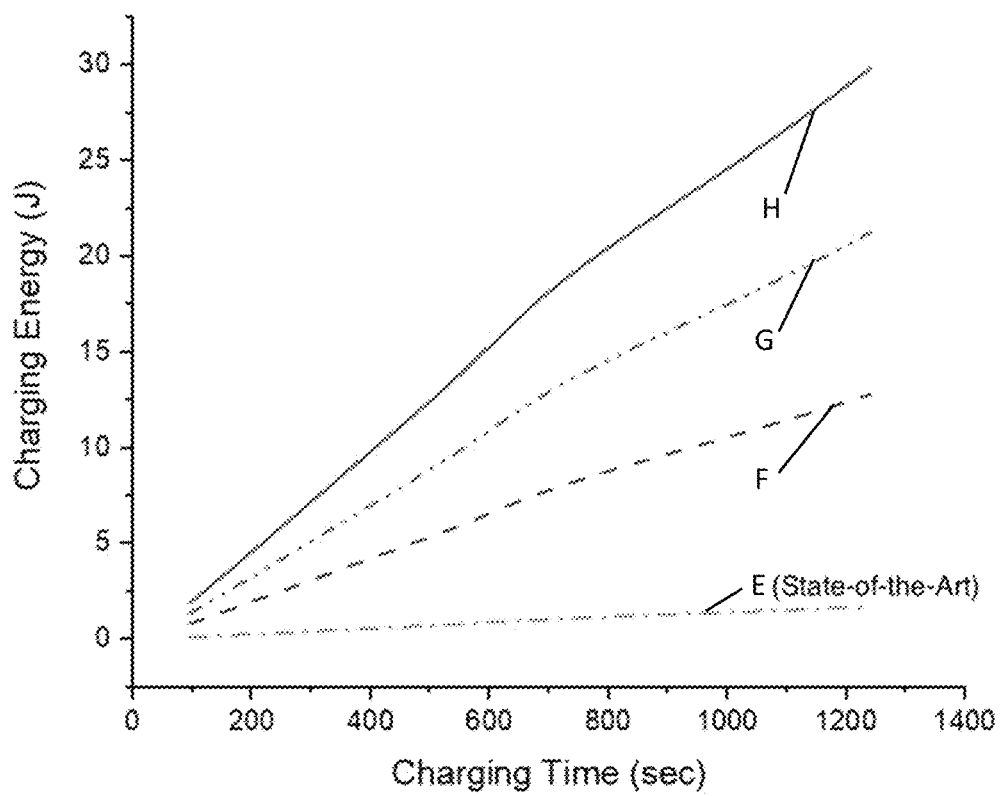
FIG. 35 is a graph illustrating a comparison between energy charging over time achieved using a transducing device of the present invention and the energy charging over time achieved using a transducing device known in the general art.

FIG. 35 is a graph showing graphs F, G, H, which show charging energy of a device 100, 201, 300, 400 as a function of time (under equal vibration frequency). The difference between graphs F, G, H is the amplitude of the vibration (i.e., external force applied to the frame). The external force applied at graph H is larger than the external force applied at graph G, which is larger than the external force applied at graph F. The said magnitudes for F, G, and H correspond to the state of excitation for the power generation graphs B, C, D, respectively, as explained above in FIG. 34. The graph E shows charging energy as a function of time of a state-of-the-art device, where the external force applied to the state-of-the-art device is the same as the external force applied to frame at graph F.

The graphs A-H of FIGS. 34 and 35 were constructed using experimental data collected by the inventor of the present invention. These graphs clearly show the following advantages of the devices of the present invention with respect to devices known in the art.

The device of the present invention high power generation per unit acceleration for a given range of excitation magnitudes. This advantage is shown by the data by the higher power curves for a given input magnitude. The output power and the charging energy shown in FIGS. 34 and 35 scale monotonically to the magnitude of input excitation. Such power improvement can be attributed to the efficient mechanical leverage of the frame of the present invention.

The device of the present invention has higher power generation per unit acceleration for a given range of excitation frequencies. This is shown by graphs B, C, D having a flatter power curve for a given range of input frequency than graph A. Such power improvement can be attributed to the progressive compliance of the frame design.

The device of the present invention has greater energy generation per unit time for a given input range of acceleration and excitation frequency. This advantage is represented by the area swept by the electrical power generated over a finite period of time in the graphs of FIG. 34. It is self-evident from FIG. 34 that a higher power over all magnitude and frequency range also provides a means of higher energy over time generated from a given excitation, as shown in FIG. 35.

What is claimed is:

1. A frame for an energy transducer device for generating electrical current, the frame comprising:
    a first pressure receiver unit;
    a first arm and a second arm, each arm having a respective first end and a respective second end, the first end of the first arm being joined to a first lateral side of the first pressure receiver unit and the first end of the second arm being joined to a second lateral side of the first pressure receiver unit;
    a first attachment unit joined to the second end of the first arm;

a second attachment unit joined to the second end of the second arm;

wherein the first pressure receiver unit, the first arm, the second arm, the first attachment unit, and the second attachment unit form a single monolithic frame;

wherein the frame is configured to hold a current generating element having a first edge and a second edge, the first attachment unit being configured to be joined to the first edge and the second attachment unit being configured to be joined to the second edge, the current generating element comprising at least one of:

a piezoelectric element, configured to change an electric polarization thereof when a mechanical strain thereof is changed, a change in the corresponding electric field being transformable into electrical current in a closed circuit; and a piezomagnetic element, configured to change magnetic polarization thereof when a mechanical strain thereof is changed, a change in the corresponding magnetic field being transformable into electrical current via an inductance coil;

such that:

an external force applied at the first pressure receiver unit causes the first pressure receiver unit to move toward or away from the current generating element, thereby causing the first arm and the second arm to rotate in opposite directions with respect to the first pressure receiver unit and in opposite directions with respect to the first attachment unit and second attachment unit, respectively, thus applying first forces in different directions to the respective attachment units, causing the respective attachment units to apply second forces in different directions to the respective edges of the current generating element, thereby changing the mechanical strain of the current generating element.

2. The frame of claim 1, wherein:

the current generating element extends along a first axis, such that the first edge and the second edge are located at respective locations along the first axis;

the second forces applied to the respective edges of the current generating element by the respective attachment units are in opposite directions along the first axis, thereby changing the strain of the current generating element uniaxially along the first axis.

3. The frame of claim 1, wherein the first arm and the second arm have equal lengths, and a projection of the first pressure receiver unit on the current generating element falls on a midpoint between the first edge and the second edge, such that the external force on first pressure receiver unit causes the second forces to be equal in magnitude to each other.

4. The frame of claim 1, comprising:

a second pressure receiver unit;

a third arm and a fourth arm, each having a respective third end and a respective fourth end, the third end of the third arm being joined to a first lateral side of the second pressure receiver unit and the third end of the fourth arm being joined to a second lateral side of the second pressure receiver unit;

wherein:

the fourth end of the third arm is joined to the first attachment unit;

the fourth end of the fourth arm is joined to the second attachment unit;

a second external force applied at the second pressure receiver unit causes the second pressure receiver unit to move toward or away from the current generating element, thereby causing the third arm and the fourth arm to rotate in opposite directions with respect to the second pressure receiver unit and in opposite directions with respect to the first attachment unit and second attachment unit, respectively, the third and fourth arms thus applying third forces in different directions to the respective attachment units, causing the respective attachment units to apply fourth forces in different directions to the respective edges of the current generating element, thereby changing the mechanical strain of the current generating element;

the first pressure receiver unit, the first arm, the second arm, the second pressure receiver unit, the third arm, the fourth arm, the first attachment unit, and the second attachment unit form a single monolithic frame.

5. The frame of claim 4, wherein:

the current generating element extends along a first axis, such that the first edge and the second edge are located at respective locations along the first axis;

the second pressure receiver unit is positioned symmetrically opposite the first pressure receiver unit with respect to the first axis;

the third arm is positioned symmetrically opposite the first arm with respect to the first axis; and the fourth arm is positioned symmetrically opposite the second arm with respect to the first axis.

6. The frame of claim 4, wherein the third arm and the fourth arm have equal length, and a projection of the second pressure receiver unit on the current generating element falls on a midpoint between the first edge and the second edge, such that the second external force on the second pressure receiver unit causes the fourth forces to be equal in magnitude to each other.

7. The frame of claim 1, wherein each of the arms is corrugated, having a wavy shape between the respective first end and the second end.

8. The frame of claim 1, wherein:

the first arm has a first central portion that is thicker than the first end of the first arm and the second end of the first arm, such that motion of the first pressure receiver unit toward and away from the current generating element cause rotation of the first arm with respect to the first pressure receiving unit about the first end of the first arm and rotation of the first arm with respect to the first attachment unit about the second end of the first arm;

the second arm has a second central portion that is thicker than the first end of the second arm and the second end of the second arm, such that motion of the first pressure receiver unit toward and away from the current generating element cause rotation of the second arm with respect to the first pressure receiver unit about the first end of the second arm and rotation of the second arm with respect to the second attachment unit about the second end of the second arm.

9. The frame of claim 1, wherein:

the first pressure receiving element is thicker than first arm and than the second arm;

the first attachment unit is thicker than the first arm;

the second attachment unit is thicker than the second arm.

10. The frame of claim 1, wherein:

the first arm has a first groove traversing the first arm and extending between the first end of the first arm and the second end of the first arm; and the second arm has a second groove traversing the second arm and extending between the first end of the second arm and the second end of the second arm.

11. The frame of claim 1, wherein a shape formed by the first arm, the first pressure receiver unit, and the second arm is convex at rest, such that a distance between the first pressure receiver and the current generating element is larger than a distance between the second end of the first arm and the current generating element and larger than a distance between the second end of the second arm and the current generating element, such that the motion of the first pressure receiver unit towards the current generating element causes the second forces applied on the current generating element point away from the current generating element.

12. The frame of claim 1, wherein a shape formed by the first arm, the first pressure receiver unit, and the second arm is concave at rest, such that a distance between the first pressure receiver and the current generating element is smaller than a distance between the second end of the first arm and the current generating element and larger than a distance between the second end of the second arm and the current generating element, such that the motion of the first pressure receiver unit towards the current generating element causes the second forces applied on the current generating element point toward to the current generating element.

13. An energy transducer device for generating electrical current, the device comprising:
the frame of claim 1; and
the current generating element of claim 1.

14. The device of claim 13, wherein the current generating elements is pre-strained when the frame is at rest.

15. The device of claim 13, comprising at least one spacer located between the first attachment unit and the first end of the current generating element, wherein:
the frame has a first coefficient of thermal expansion;
the current generating element has a second coefficient of thermal expansion;
the spacer has a third coefficient of thermal expansion, such that a difference between a first temperature dependent size change of the frame and a second temperature dependent size change of the current generating element is at least partially compensated by a third temperature dependent size change of the spacer, within a predetermined range of temperatures.

16. An energy transducer device for generating electrical current, the device comprising:
a first pressure receiver unit;
a first arm and a second arm, each arm having a respective first end and a respective second end, the first end of the first arm being joined to a first lateral side of the first pressure receiver unit and the first end of the second arm being joined to a second lateral side of the first pressure receiver unit;
a first attachment unit joined to the second end of the first arm;
a second attachment unit joined to the second end of the second arm;
a current generating element having a first edge and a second edge, the first edge being joined to the first attachment unit and the second edge being joined to the second attachment unit, the current generating element comprising one of:
  a piezoelectric element, configured to change an electric polarization thereof when a mechanical strain thereof is changed, a change in the corresponding electric field being transformed into electrical current in a closed circuit; and
  a piezomagnetic element, configured to change a magnetic polarization thereof when a mechanical strain thereof is changed, a change in the corresponding magnetic field being transformable into electrical current via an inductance coil;
a second pressure receiver unit;
a third arm and a fourth arm, each having a respective third end and a respective fourth end, the third end of the third arm being joined to a first lateral side of the second pressure receiver unit and the third end of the fourth arm being joined to a second lateral side of the second pressure receiver unit, the fourth end of the third arm being joined to the first attachment unit, and the fourth end of the fourth arm being joined to the second attachment unit;
wherein:
a first external force applied at the first pressure receiver unit causes the first pressure receiver unit to move toward or away from the current generating element, thereby causing the first arm and the second arm to rotate in opposite directions with respect to the first pressure receiver unit and in opposite directions with respect to the first attachment unit and second attachment unit, respectively, thus applying first forces in different directions to the respective attachment units, causing the respective attachment units to apply second forces in different directions to the respective edges of the current generating element, thereby changing the mechanical strain of the current generating element;
a second external force applied at the second pressure receiver unit causes the second pressure receiver unit to move toward or away from the current generating element, thereby causing the third arm and the fourth arm to rotate in opposite directions with respect to the second pressure receiver unit and in opposite directions with respect to the first attachment unit and second attachment unit, respectively, the third and fourth arms thus applying third forces in different directions to the respective attachment units, causing the respective attachment units to apply fourth forces in different directions to the respective edges of the current generating element, thereby changing the mechanical strain of the current generating element;
the first pressure receiver unit, the first arm, the second arm, the second pressure receiver unit, the third arm, the fourth arm, the first attachment unit, and the second attachment unit form a single monolithic frame.

17. The device of claim 16, wherein:
the current generating element extends along a first axis, such that the first edge and the second edge are located at respective locations along the first axis;
the second pressure receiver unit is positioned symmetrically opposite the first pressure receiver unit with respect to the first axis;
the third arm is positioned symmetrically opposite the first arm with respect to the first axis; and
the fourth arm is positioned symmetrically opposite the second arm with respect to the first axis.

18. The device of claim 16, wherein:
the first arm and the second arm have equal lengths, and a first projection of the first pressure receiver unit on the current generating element falls on a midpoint between the first edge and the second edge, such that the pressure on first pressure receiver unit causes the second forces to be equal in magnitude to each other;
the third arm and the fourth arm have equal length, and a second projection of the second pressure receiver unit on the current generating element falls on the midpoint between the first edge and the second edge, such that pressure on the second pressure receiver unit causes the fourth forces to be equal in magnitude to each other.

19. The device of claim 16, wherein:
a first shape formed by the first arm, the first pressure receiver unit, and the second arm is convex at rest, such that a distance between the first pressure receiver unit and the current generating element is larger than a distance between the second end of the first arm and the current generating element and larger than a distance between the second end of the second arm and the current generating element, such that the motion of the first pressure receiver unit towards the current generating element causes the second forces applied on the current generating element point away from the current generating element;
a second shape formed by the third arm, the second pressure receiver unit, and the fourth arm is convex at rest, such that a distance between the second pressure receiver unit and the current generating element is larger than a distance between the fourth end of the third arm and the current generating element and larger than a distance between the fourth end of the fourth arm and the current generating element, such that the motion of the second pressure receiver unit towards the current generating element causes the fourth forces applied on the current generating element point way from the current generating element.

20. The device of claim 16, wherein:
a first shape formed by the first arm, the first pressure receiver unit, and the second arm is concave at rest, such that a distance between the first pressure receiver unit and the current generating element is smaller than a distance between the second end of the first arm and the current generating element and smaller than a distance between the second end of the second arm and the current generating element, such that the motion of the first pressure receiver unit towards the current generating element causes the second forces applied on the current generating element point toward the current generating element;
a second shape formed by the third arm, the second pressure receiver unit, and the fourth arm is concave at rest, such that a distance between the second pressure receiver unit and the current generating element is smaller than a distance between the fourth end of the third arm and the current generating element and smaller than a distance between the fourth end of the fourth arm and the current generating element, such that the motion of the second pressure receiver unit towards the current generating element causes the fourth forces applied on the current generating element point toward the current generating element.

21. The device of claim 16, wherein:
the first arm has a first central portion that is thicker than the first end of the first arm and the second end of the first arm, such that motion of the first pressure receiver unit toward and away from the current generating element cause rotation of the first arm with respect to the first pressure receiving unit about the first end of the first arm and rotation of the first arm with respect to the first attachment unit about the second end of the first arm;
the second arm has a second central portion that is thicker than the first end of the second arm and the second end of the second arm, such that motion of the first pressure receiver unit toward and away from the current generating element cause rotation of the second arm with respect to the first pressure receiver unit about the first end of the second arm and rotation of the second arm with respect to the second attachment unit about the second end of the second arm;
the third arm has a third central portion that is thicker than the first end of the third arm and the second end of the third arm, such that motion of the second pressure receiver unit toward and away from the current generating element cause rotation of the third arm with respect to the second pressure receiving unit about the first end of the third arm and rotation of the third arm with respect to the first attachment unit about the second end of the third arm; and
the fourth arm has a fourth central portion that is thicker than the first end of the fourth arm and the second end of the fourth arm, such that motion of the second pressure receiver unit toward and away from the current generating element cause rotation of the fourth arm with respect to the second pressure receiver unit about the first end of the fourth arm and rotation of the fourth arm with respect to the second attachment unit about the second end of the fourth arm.

* * * * *